US012771341B2

(12) United States Patent
Jonishi

(10) Patent No.: US 12,771,341 B2
(45) Date of Patent: Oct. 20, 2026

(54) SWITCHING CONTROL CIRCUIT

(71) Applicant: FUJI ELECTRIC CO., LTD., Kawasaki (JP)

(72) Inventor: Akihiro Jonishi, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 18/779,646

(22) Filed: Jul. 22, 2024

(65) Prior Publication Data

US 2025/0096793 A1 Mar. 20, 2025

(30) Foreign Application Priority Data

Sep. 14, 2023 (JP) ................................ 2023-149198

(51) Int. Cl.
*H03K 17/16* (2006.01)
*H03K 19/0185* (2006.01)

(52) U.S. Cl.
CPC ... *H03K 17/168* (2013.01); *H03K 19/018507* (2013.01); *H03K 2217/0063* (2013.01)

(58) Field of Classification Search
CPC ......... H03K 17/168; H03K 19/018507; H03K 2217/0063; H02M 1/088
See application file for complete search history.

(56) References Cited

U.S. PATENT DOCUMENTS 7,521,982 B2 4/2009 Shimizu
7,812,402 B2 10/2010 Hatade
8,975,944 B2 3/2015 Akahane
2020/0044652 A1* 2/2020 Yamaji ............. H03K 17/08128

FOREIGN PATENT DOCUMENTS

EP 3376660 B1 9/2018
JP 4620437 B2 1/2011
JP 4672575 B2 4/2011
JP 5459412 B2 4/2014
JP 6552109 B2 7/2019

* cited by examiner

*Primary Examiner* — Metasebia T Retebo
(74) *Attorney, Agent, or Firm* — Rabin & Berdo, P.C.

(57) ABSTRACT

A switching control circuit configured to control switching of a first switching device on a power supply side and a second switching device on a ground side, the first and second switching devices being configured to drive a load, the first switching device having an electrode on a low-potential side thereof. The switching control circuit includes: a first level shifter circuit including a first resistor and a first transistor; a driver circuit configured to drive the first switching device, in response to an output from the first level shifter circuit; a first switch connected in parallel with the first resistor; and an ON-OFF control circuit configured to turn on the first switch, in response to a voltage at the electrode becoming negative.

9 Claims, 24 Drawing Sheets

SWITCHING CONTROL CIRCUIT

CROSS-REFERENCE TO RELATED APPLICATIONS

The present application claims priority pursuant to 35 U.S.C. § 119 from Japanese patent application number 2023-149198, filed on Sep. 14, 2023, the entire disclosure of which is hereby incorporated by reference herein.

BACKGROUND

Technical Field

The present disclosure relates to a switching control circuit.

Description of the Related Art

In a bridge circuit for power conversion, respective switching devices in an upper arm and a lower arm are operated under control of a switching control circuit, to thereby perform power conversion (for example, Japanese Patent No. 4620437).

The switching control circuit includes a driver circuit that drives the upper-arm switching device and the lower-arm switching device, a control circuit that controls the driver circuit, and a level shifter circuit that transmits signals between the control circuit and the driver circuit.

In the switching control circuit, the lower-arm switching device operates using a ground voltage as a reference, and the upper-arm switching device operates using, as a reference, a VS potential that varies with on and off of the lower-arm switching device.

Thus, the level shifter circuit level-shifts an input signal to the upper-arm switching device based on the ground potential, to a signal based on the VS potential, to thereby output a resultant signal to the driver circuit.

The level shifter circuit includes, for example, a resistor connected to a floating power supply potential VB, and an n-channel metal-oxide-semiconductor field-effect transistor (nMOSFET) provided between the resistor and the ground. In response to the nMOSFET being turned on, the potential at the connection node between the nMOSFET and the resistor will be a voltage that is lower than the floating power supply potential VB by a predetermined voltage that is determined by the product of the resistance and the on-current of the nMOSFET. Meanwhile, in response to the nMOSFET being turned off, the potential at the connection node reaches the floating power supply potential VB. This causes the input signal based on the ground potential to be level-shifted to the signal based on the VS potential.

Incidentally, in response to the upper-arm switching device being switched from on to off, so-called negative voltage noise may be generated, where the VS potential at the node at which the upper-arm switching device and the lower-arm switching device are connected drops below the ground potential.

If the negative voltage noise is generated, an unintended current may flow through the resistor in the level shifter circuit, which may cause fluctuation of the voltage at the connection node. If such an unintended current flows, a malfunction may occur in the signal transmission between the control circuit and the driver circuit, which may cause a malfunction in the driver circuit.

SUMMARY

An aspect of the present disclosure is a switching control circuit configured to control switching of a first switching device on a power supply side and a second switching device on a ground side, the first and second switching devices being configured to drive a load, the first switching device having an electrode on a low-potential side thereof, the switching control circuit comprising: a first level shifter circuit including a first resistor and a first transistor; a driver circuit configured to drive the first switching device, in response to an output from the first level shifter circuit; a first switch connected in parallel with the first resistor; and an ON-OFF control circuit configured to turn on the first switch, in response to a voltage at the electrode becoming negative.

DETAILED DESCRIPTION

Figure 1:
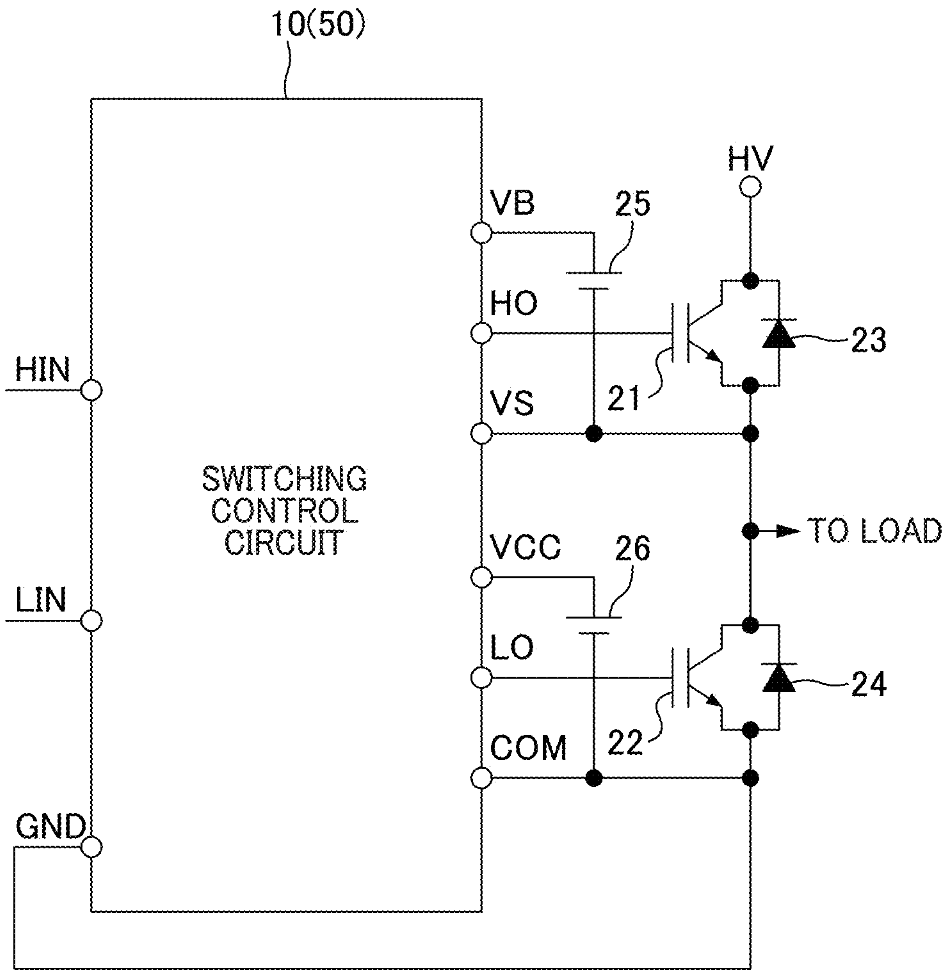
FIG. 1 is a circuit diagram illustrating an overview of a typical switching control circuit 10.

Hereinafter, embodiments of the present disclosure will be described with reference to the drawings. The same or equivalent constituent elements, members, and the like illustrated in the drawings are given the same reference numerals, and repetitive description is omitted as appropriate. At least following matters will become apparent from the descriptions of the present Description and the accompanying drawings.

==Typical Switching Control Circuit 10==

First, a typical switching control circuit 10 will be described. FIG. 1 is a circuit diagram illustrating an overview of the switching control circuit 10. The switching control circuit 10 controls switching of a power-supply-side switching device (corresponding to a "first switching device") that drives a load and a ground-side switching device (corresponding to a "second switching device").

FIG. 1 illustrates an example of connection between the switching control circuit 10 and Insulated Gate Bipolar Transistors (IGBTs) 21 and 22, which are switching devices constituting a bridge circuit for power conversion.

As illustrated in FIG. 1, in this example, the IGBT 21 is used as the power-supply-side switching device, and the IGBT 22 is used as the ground-side switching device.

The IGBT 21, which is the switching device on the power supply side, may be hereinafter referred to as "upper arm IGBT 21". Further, the IGBT 22, which is the switching device on the ground side, may be hereinafter referred to as "lower arm IGBT 22".

The IGBTs 21 and 22 are connected in series with each other, and constitute a half bridge. Freewheeling diodes 23 and 24 are connected in anti-parallel with the IGBTs 21 and 22, respectively.

Ground potential (GND potential) is applied to the emitter of the lower arm IGBT 22. A power supply potential (HV potential) is applied to the collector of the upper arm IGBT 21.

A reference sign "VS" illustrated in FIG. 1 represents an intermediate potential that varies in a range from the HV potential to the GND potential. A reference sign "VB" represents a potential on the high potential side of a power supply 25 using the VS potential as a reference. A reference sign "COM" represents a reference potential and is the GND potential. A reference sign "VCC" represents a potential on the high potential side of the power supply 26 using the GND potential as a reference.

A reference signs "HIN" and "LIN" represent input signals to be inputted from a microcomputer or the like to a control circuit 11, which will be described later. A reference sign "HO" represents a high-side output signal that is to be outputted to the gate of the upper arm IGBT 21. A reference sign "LO" represents a low-side output signal that is to be outputted to the gate of the lower arm IGBT 22.

The switching control circuit 10 alternately turns on the upper arm IGBT 21 and the lower arm IGBT 22, to thereby alternately output a high potential and a low potential from a VS terminal, which is an output terminal of the switching control circuit 10, to supply alternating current (AC) power to a load.

That is, when the switching control circuit 10 outputs the high potential to the load, the IGBTs 21 and 22 are operated such that the upper arm IGBT 21 is turned on and the lower arm IGBT 22 is turned off. Meanwhile, when the switching control circuit 10 outputs the low potential to the load, the IGBTs 21 and 22 are operated such that the upper arm IGBT 21 is turned off and the lower arm IGBT 22 is turned on.

In this event, the switching control circuit 10 outputs a gate signal that uses the GND potential as a reference, to the gate of the IGBT 22 in the lower arm, and outputs a gate signal that uses the VS potential as a reference, to the gate of the upper arm IGBT 21.

The VS potential varies with on and off of the upper arm IGBT 21 and the lower arm IGBT 22. Thus, as will be described later in detail, the switching control circuit 10 needs to include a level shifter circuit (described later).

<<<Details of Switching Control Circuit 10>>>

Figure 2:
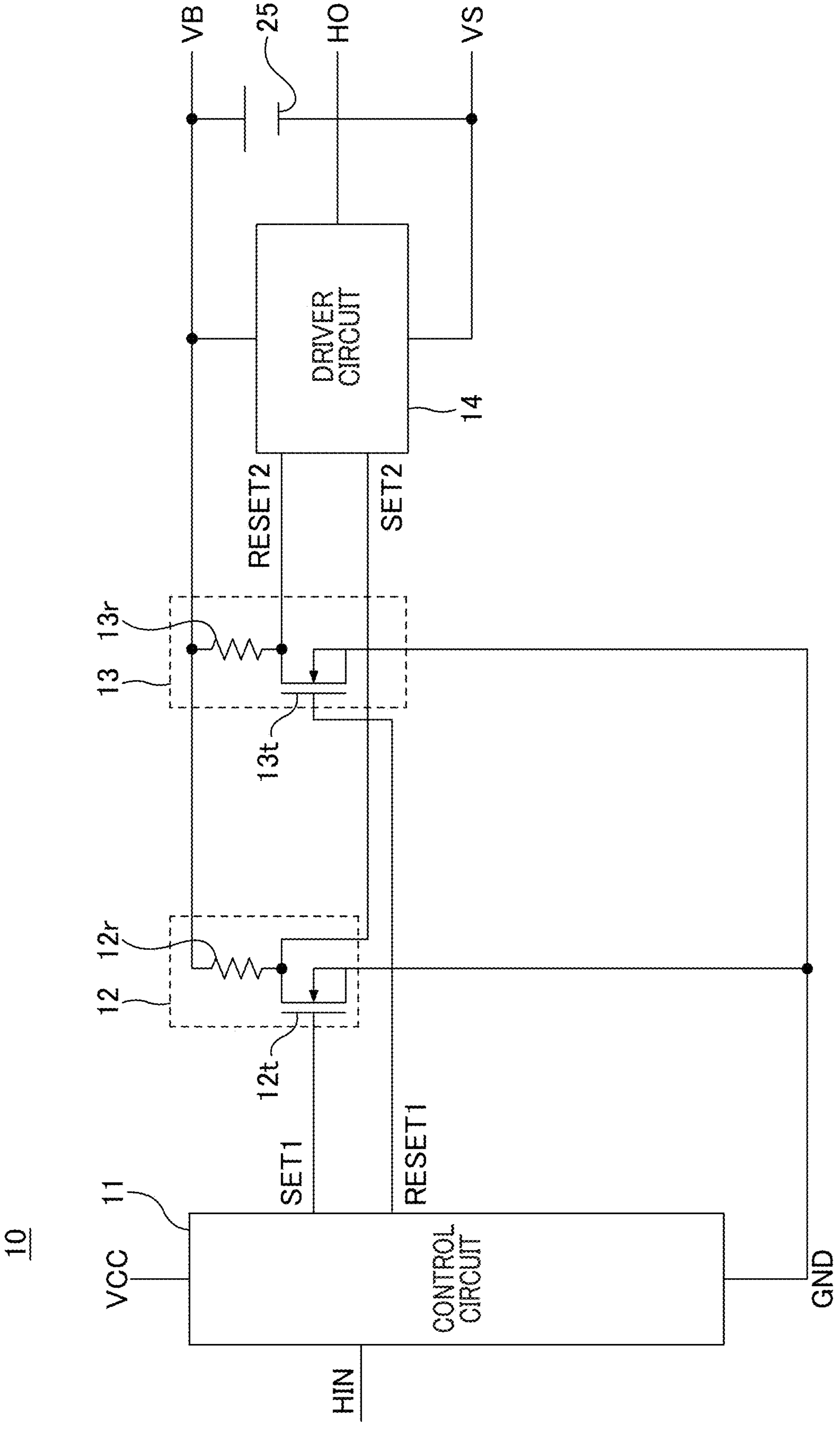
FIG. 2 is a circuit diagram for illustrating the details of a switching control circuit 10.

FIG. 2 is a circuit diagram illustrating the details of the switching control circuit 10. The switching control circuit 10 includes the control circuit 11, a level shifter circuit 12 (corresponding to a "first level shifter circuit"), a level shifter circuit 13 (corresponding to a "second level shifter circuit"), and a driver circuit 14.

The control circuit 11 controls the level shifter circuits 12 and 13. The control circuit 11 outputs a set signal SET1 to the level shifter circuit 12, in response to the received input signal HIN changing from a low (L) level (hereinafter, referred to as low) to a high (H) level (hereinafter, referred to as high).

Further, the control circuit 11 outputs a reset signal RESET1 to the level shifter circuit 13, in response to the received input signal HIN changing from high to low.

The level shifter circuit 12 includes a resistor 12*r* (corresponding to a "first resistor") and a transistor 12*t* (corresponding to a "first transistor"). The level shifter circuit 12 outputs the set signal SET2 to switch the upper arm IGBT 21 from off to on.

Note that in the following, the level shifter circuit 12 may be referred to as "set-side level shifter circuit 12", the resistor 12*r* may be referred to as "set-side resistor 12*r*", and the transistor 12*t* may be referred to as "set-side transistor 12*t*".

In this example, the transistor 12*t* is an n-channel metal-oxide-semiconductor (NMOS) transistor. The gate of the transistor 12*t* is connected to the control circuit 11. The drain of the transistor 12*t* is connected to one end of the resistor 12*r* and a driver circuit 14 (described later). The ground potential GND is applied to the source of the transistor 12*t*. The other end of the resistor 12*r* is connected to the power supply 25 on the high potential side.

The level shifter circuit 13 includes a resistor 13*r* (corresponding to a second resistor") and a transistor 13*t* (corresponding to a "second transistor"). The level shifter circuit 13 outputs a reset signal RESET2 to switch the upper arm switching device 21 from on to off.

Note that in the following, the level shifter circuit 13 may be referred to as "reset-side level shifter circuit 13", the resistor 13*r* may be referred to as "reset-side resistor 13*r*", and the transistor 13*t* may be referred to as "reset-side transistor 13*t*".

In this example, the transistor 13*t* is an NMOS transistor. The gate of the transistor 13*t* is connected to the control circuit 11. The drain of the transistor 13*t* is connected to one end of the resistor 13*r* and the driver circuit 14. The GND potential is applied to the source of the transistor 13*t*. The other end of the resistor 13*r* is connected to the power supply 25 on the high potential side.

The driver circuit 14 drives the switching device 21, in response to the outputs from the level shifter circuits 12 and 13. That is, the driver circuit 14 drives the IGBT 21, in response to the set signal SET2 from the level shifter circuit 12 and the reset signal RESET2 from the level shifter circuit 13.

Note that in this example, only the driver circuit 14 that drives the upper arm switching device 21 is illustrated, and the description of the driver circuit that drives the lower arm switching device 22 is omitted for convenience.

<<<Operation of Switching Control Circuit 10>>>

The switching operation of the switching control circuit 10 will be described. In the following, a description will be given of each of an operation when the input signal HIN inputted to the control circuit 11 changes from low to high, and conversely, an operation when the input signal HIN changes from high to low.

First, the operation when the input signal HIN inputted to the control circuit 11 changes from low to high will be described.

In this event, the control circuit 11 outputs the set signal SET1 to the set-side transistor 12*t* such that the set-side transistor 12*t* will be on for a predetermined time period.

The set-side transistor 12*t* converts the set signal SET1 received from the control circuit 11 into the set signal SET2 that uses the VS potential as a reference, and outputs the set signal SET2 to the driver circuit 14.

Specifically, the set-side transistor 12*t* outputs, to the driver circuit as the set signal SET2, a drain potential that has dropped below the floating power supply potential VB by a predetermined voltage due to the current flowing through the resistor 12*r*.

The driver circuit 14 switches an output HO of the driver circuit from low to high, in response to the set signal SET2 from the set-side transistor 12*t*.

Next, a description will be given of the operation when the input signal HIN inputted to the control circuit 11 changes from high to low.

In this event, the control circuit 11 outputs the reset signal RESET1 to the reset-side transistor 13*t* such that the reset-side transistor 13*t* will be on for a predetermined time period.

The reset-side transistor 13*t* converts the reset signal RESET1 received from the control circuit 11 into the reset signal RESET2 that uses the VS potential as a reference, and outputs the reset signal RESET2 to the driver circuit 14.

Specifically, the reset-side transistor 13*t* outputs, to the driver circuit 14 as the reset signal RESET2, the drain potential that has dropped below the floating power supply potential VB by a predetermined voltage due to the current flowing through the resistor 13*r*.

The driver circuit 14 switches the output HO of the driver circuit 14 from high to low, in response to the reset signal RESET2 from the reset-side transistor 13*t*.

<Planar Structure>

Figure 3:
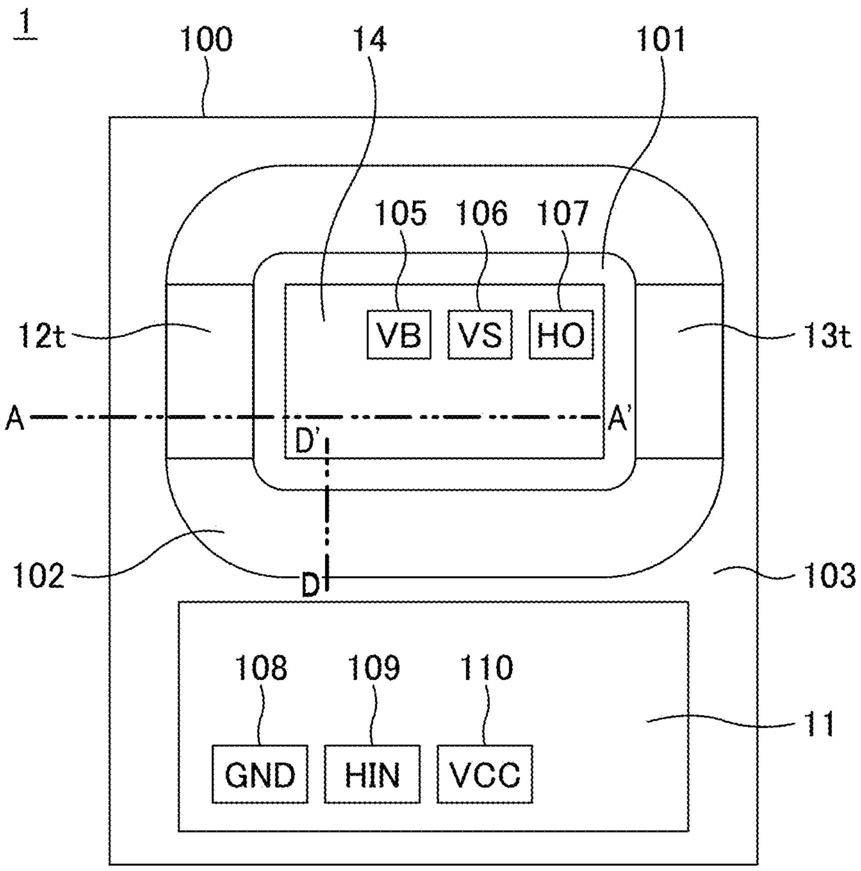
FIG. 3 is a diagram illustrating a semiconductor device 1 to which a switching control circuit 10 is mounted.

FIG. 3 is a diagram illustrating a semiconductor device 1 to which the switching control circuit 10 is mounted. The semiconductor device 1 includes, on a p type semiconductor substrate 100, a high side region 101 (corresponding to a "high side region"), a High Voltage Junction Termination region (HVJT) 102, and a reference potential region 103 (corresponding to a "reference potential region"). Examples of the semiconductor substrate 100 includes a silicon (Si) substrate.

The driver circuit 14 is formed in the high side region 101. In addition, a VB terminal 105, a VS terminal 106, and an HO terminal 107 are arranged in the high side area 101. The VB terminal 105 is a terminal to receive VB potential. The VS terminal 106 is a terminal to output VS application. The HO terminal 107 is a terminal to receive HO potential.

The HVJT 102 is provided around the high side region 101. Part of the set-side transistor 12*t* and part of the reset-side transistor 13*t* are provided in the HVJT 102 (described later in detail).

The reference potential region 103 is a region at the front surface of the semiconductor substrate 100 excluding the high side region 101 and the HVJT 102. The reference potential region 103 is electrically isolated from the high side region 101 by the HVJT 102.

The control circuit 11 is formed in the reference potential region 103. A GND terminal 108, an HIN terminal 109, and a VCC terminal 110 are arranged in the reference potential region 103. The GND terminal 108 is a terminal to receive the GND potential, which is the reference potential of the control circuit 11. The HIN terminal 109 is a terminal to input the input signal HIN to the control circuit 11. The VCC terminal is electrically connected with a power supply (not illustrated) of the control circuit 11, and is a terminal to receive VCC potential, which is the power supply potential of the control circuit 11.

An embodiment of the present disclosure gives an aspect in which the switching control circuit 10 is mounted to the single semiconductor substrate 100. However, the present disclosure is not limited thereto, and the semiconductor device 1 may include two semiconductor chips respectively including, for example, a configuration corresponding to the high side region 101 and a configuration corresponding to the reference potential region 103, on a substrate such as Direct Bonded Copper (DCB) substrate or the like.

<Cross-Sectional Structure>

Figure 4:
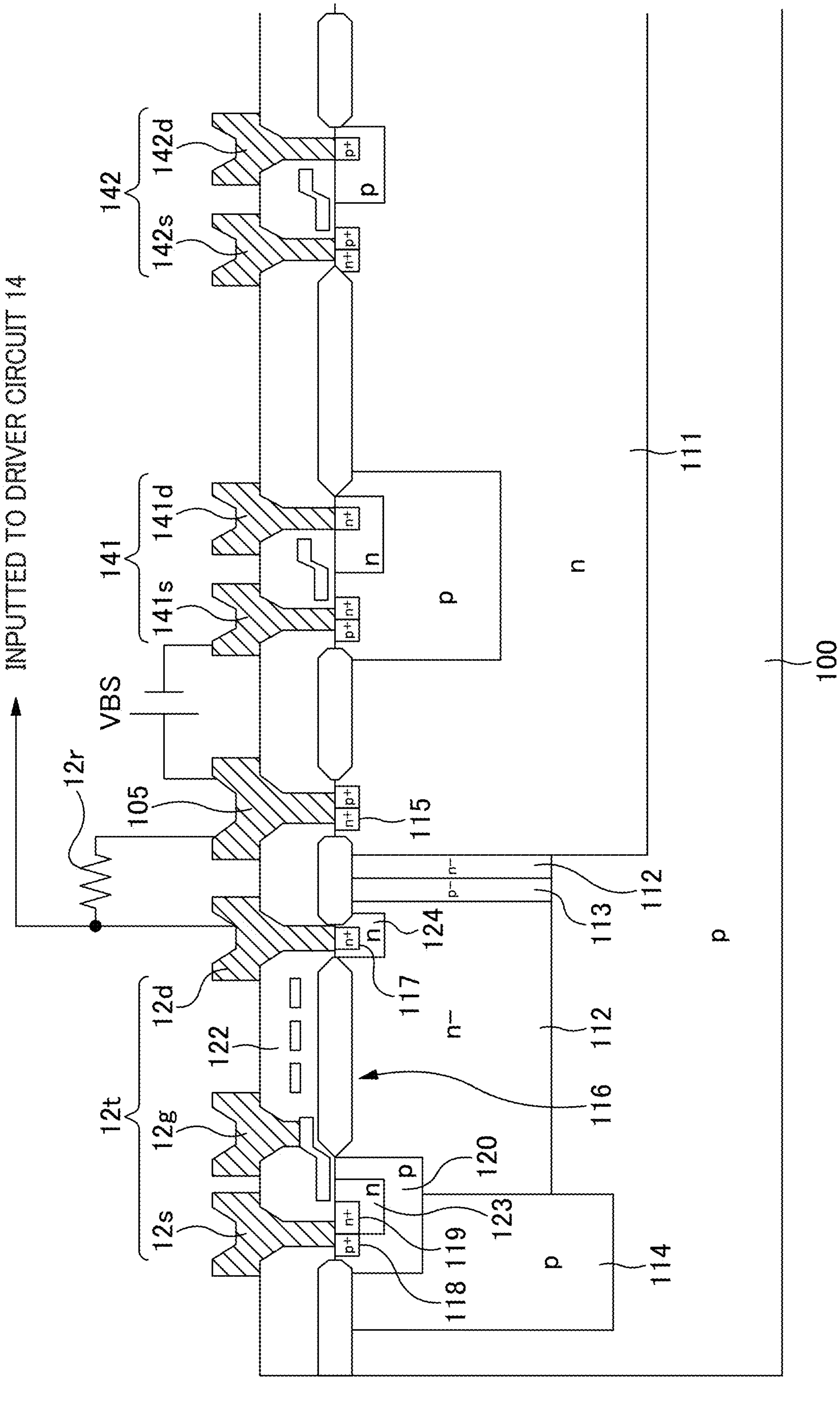
FIG. 4 is a diagram illustrating a partial cross section of a semiconductor device 1.
Figure 5:
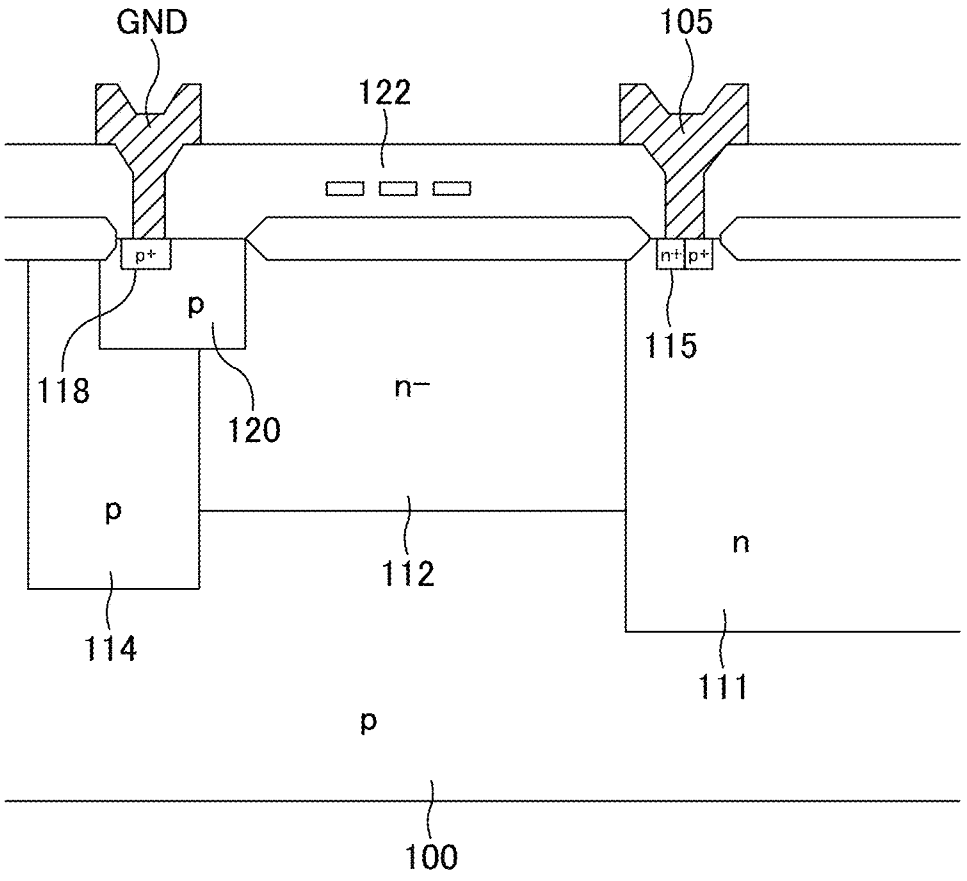
FIG. 5 is a diagram illustrating a partial cross section of a semiconductor device 1.

FIG. 4 is a diagram illustrating a cross section of the semiconductor device 1 taken along line A-A' including the set-side transistor 12*t* of FIG. 3. FIG. 5 is a diagram illustrating a cross section of the semiconductor device 1 taken along line D-D' including the HVJT 102 of FIG. 3.

As illustrated in FIGS. 4 and 5, the semiconductor device 1 includes an n type region 111, an n− type region 112, a p-type region 113, and a p type region 114 that are provided at the front surface of the p type semiconductor substrate 100.

The n type region 111 corresponds to the high side region 101 in the plan view of FIG. 3, and the VB potential is applied thereto. Further, the driver circuit 14 is formed in the n type region 111. In FIG. 4, an n-channel metal-oxide-semiconductor field-effect transistor (nMOSFET) 141 and a p-channel MOSFET (pMOSFET) 142 constituting the driver circuit 14 are illustrated in the n type region 111. A source 141*s* of the nMOSFET 141 is connected to the VS terminal 106 (FIG. 3).

In the n type region 111, an n+ type contact region 115 is further provided. An electrode to connect to the VB terminal 105 (FIG. 3) is provided on the contact region 115.

The n− type region 112 is provided in the HVJT 102 in the plan view of FIG. 3. The HVJT 102 is a region provided outside the n type region 111, and in an embodiment of the present disclosure, is provided in an annular shape around the n type region 111. The n− type region 112 has a lower impurity concentration than the n type region 111.

As illustrated in FIG. 4, a drift region 116 and an n+ type drain region 117 of the set-side transistor 12*t* are provided in the n− type region 112. An n type region 124 is provided around the drain region 117. A drain electrode 12*d* of the transistor 12*t* is provided on the drain region 117.

The set-side transistor 12*t* has an n+ type source region 119, which is provided adjacent to a p+ type contact region, above the p type region 114, which will be described later. An n type region 123 is provided around the source region 119. A source electrode 12*s* is provided on the p+ type contact region 118 and the n+ type source region 119 so as to be in contact with these regions.

A gate electrode 12*g* of the transistor 12*t* is provided above a p type region 120, which is located between the source electrode 12*s* and the n− type region 112, through a gate insulating film 122. The reference potential is applied to the source electrode 12*s*. Further, the set signal SET1 is inputted to the gate electrode 12*g*.

The set-side resistor 12*r* is provided above the n type region 111 through an insulating film (not illustrated). The resistor 12*r* is made of polycrystalline silicon or the like.

The p− type region 113 is provided in the n− type region 112. In an embodiment of the present disclosure, the p− type region 113 is provided between the transistor 12*t* in the n− type region 112 and the n type region 111 so as to separate them.

The p− type region 113 has a depth extending through the n-type region 112 and electrically isolates the transistor 12*t* in the n− type region 112 from the n type region 111.

The p type region 120 and the p type region 114 are provided in contact with the n− type region 112. In an embodiment of the present disclosure, the p type region 120 and the p type region 114 are provided in an annular shape around the n− type region 112.

The p+ type contact region 118, which has a higher impurity concentration than the p type region 114, is provided above the p type region 114. The p+ type contact region 118 is electrically connected to the GND terminal, and the n+ type contact region 115 is electrically connected to the VB terminal. Accordingly, during normal operation, the potential at the VB terminal is higher, and thus a depletion layer extends from the pn junction between the n− type region 112 and the p type region 120 and p type region 114, mainly to the n− type region 112, and remains in the n− type region 112, thereby electrically isolating, in the lateral direction, the high side region 101 from the reference potential region 103.

In the above description, only the set-side transistor 12*t* has been mentioned, but the same applies to the reset-side transistor 13*t*.

<Malfunctions Occurring in Typical Switching Control Circuit 10>

Malfunctions occurring in the switching control circuit 10 will be described. FIGS. 6 to 14 are diagrams illustrating malfunctions occurring in the switching control circuit 10. Among these drawings, FIGS. 6 to 9 are diagrams illustrating the current flowing in the semiconductor device 1 to which the switching control circuit 10 is mounted. Further, FIG. 10 is a diagram illustrating an unintended current flowing through the switching control circuit 10.

Figure 11:
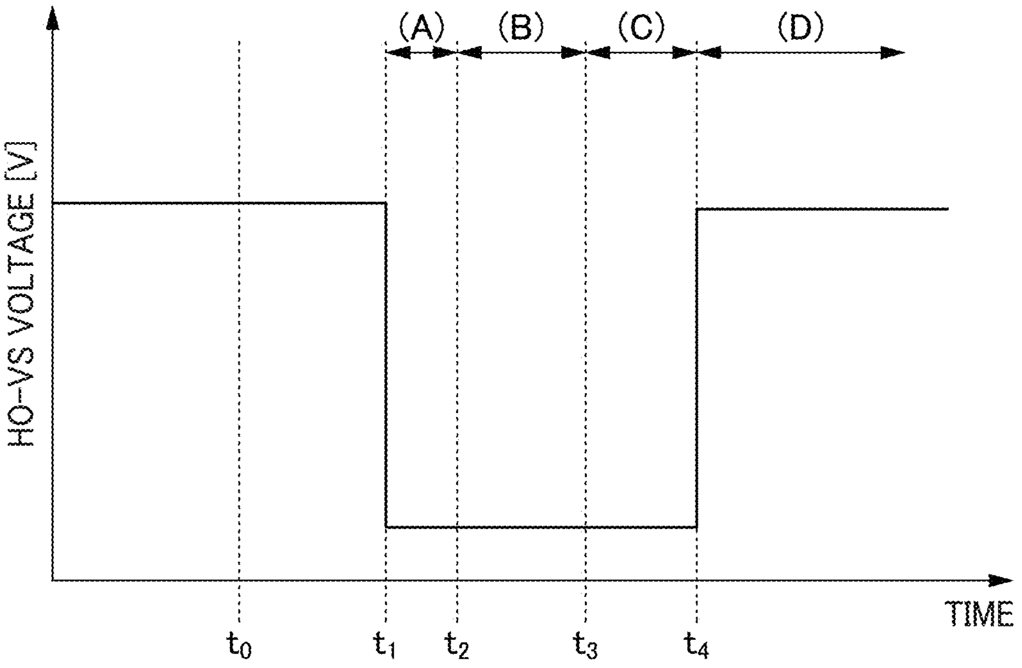
FIG. 11 is a timing chart of HO potential from a driver circuit 14.
Figure 12:
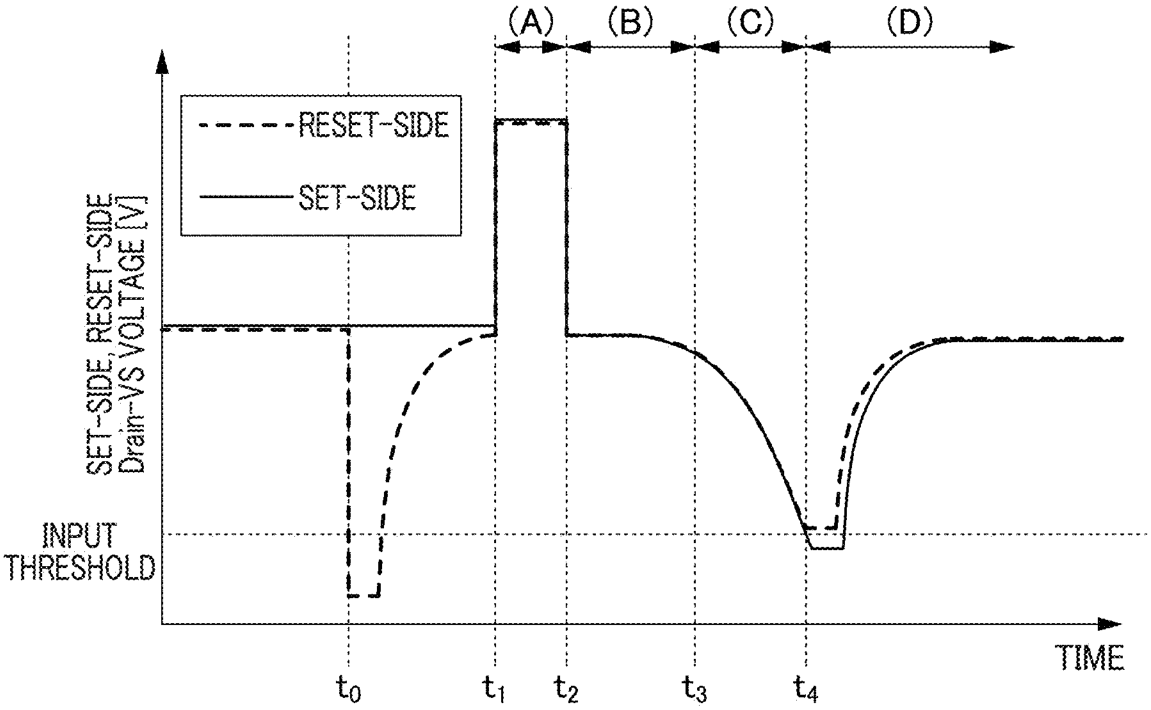
FIG. 12 is a timing chart of a drain voltage of a reset-side transistor 13*t*.
Figure 13:
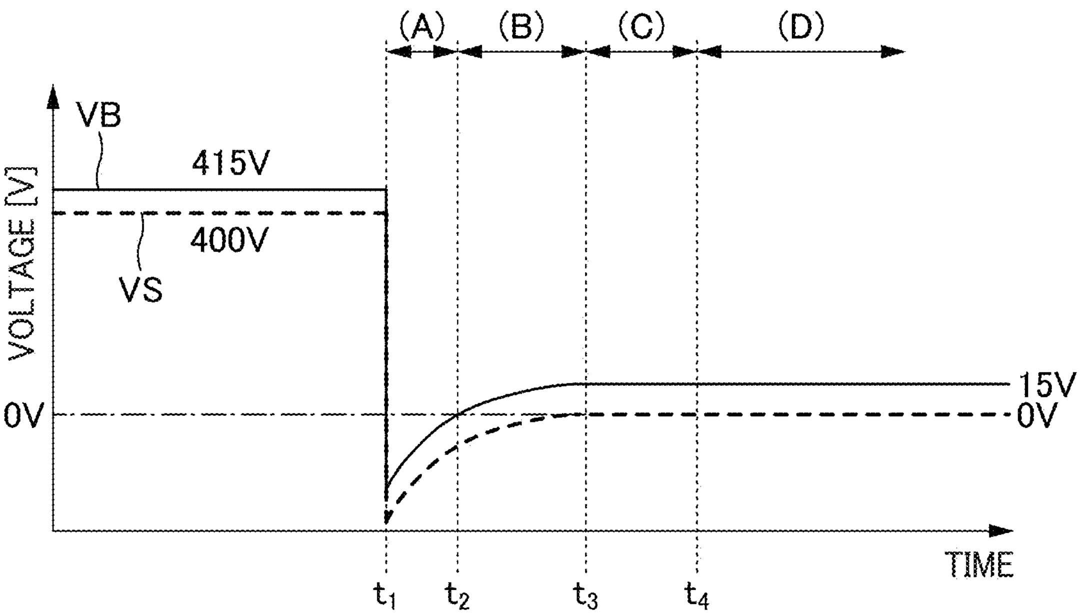
FIG. 13 is a timing chart of VB potential and VS potential.
Figure 14:
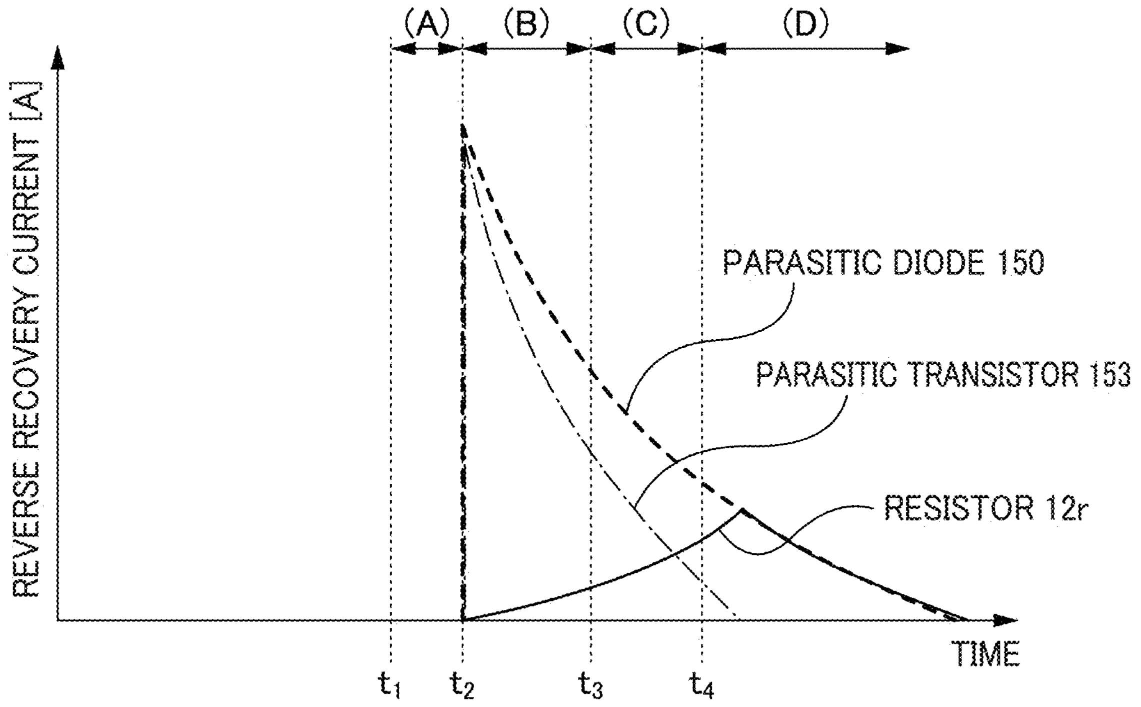
FIG. 14 is a timing chart of currents flowing through parasitic elements (described later) and a resistor 12*r*.

Further, FIGS. 11 to 14 are various timing charts of the switching control circuit 10. FIG. 11 illustrates the HO potential (FIG. 1) from the driver circuit 14 to the upper arm IGBT 21, FIG. 12 illustrates the drain voltages of the set-side transistor 12*t* and the reset-side transistor 13*t*, FIG. 13 illustrates the VB potential and VS potential, and FIG. 14 illustrates the currents flowing through parasitic elements (described later) and the resistor 12*r*.

First, parasitic elements formed inside the semiconductor device 1 will be described. As illustrated in FIGS. 6 to 9, parasitic diodes 150 and 151, a parasitic resistor 152, and a parasitic transistor 153 are formed inside the semiconductor device 1.

The parasitic diode 150 is formed by the p type semiconductor substrate 100 and the n− type region 112. The parasitic diode 151 is formed by the p type semiconductor substrate 100 and the n type region 111.

The parasitic resistor 152 is formed by the resistance of the p type semiconductor substrate 100. Further, the parasitic transistor 153 is an NPN transistor formed among the n type region 111, the p type region of the semiconductor substrate 100, and the n− type region 112. FIG. 10 illustrates an equivalent circuit of the semiconductor device 1 with these parasitic elements.

If the above-mentioned parasitic elements exist, a malfunction may occur in the switching control circuit 10 when negative voltage noise is generated. The following describes the details of such a malfunction.

The negative voltage noise is a type of switching noise that is caused by switching of the IGBTs 21 and 22.

The negative voltage noise is noise at negative voltage that is caused by the VS potential undershooting due to the influence of the inductance of wiring and the load when the upper arm IGBT 21 constituting the bridge circuit is turned off and the VS potential drops.

In the following example, it is assumed that the initial state is a state in which the upper arm IGBT 21 is on and the lower arm IGBT 22 is off. Then, such a case will be considered in which the upper arm IGBT 21 is switched off and the lower arm IGBT 22 is switched on, from the above state, in response to the reset signal RESET1 from the control circuit 11.

Time t0

First, as illustrated in FIG. 12, from the initial state, the reset-side transistor 13*t* is turned on in response to the reset signal RESET1 from the control circuit 11 at time t0.

In this event, as illustrated in FIG. 12, the drain potential of the transistor 13*t* drops below the input threshold of the driver circuit 14 due to drop in the voltage at the reset-side resistor 13*r*.

Time t1

At time t0, the drain potential of the reset-side transistor 13*t* drops below the input threshold of the driver circuit 14, and the driver circuit 14 turns off the upper arm IGBT 21 at time t1, at which a signal delay time period in the inside of the driver circuit 14 has elapsed since time t0. In this event, the driver circuit 14 switches, to low, the HO-VS voltage to the gate of the IGBT 21 (FIG. 11).

In this event, if the negative voltage noise whose absolute value is greater than the power supply voltage VBS (VB−VS) of the driver circuit 14 is generated, the VB potential will be negative during a time period until the negative voltage noise disappears (time period (A) in FIG. 13).

As a result, at time t1, the parasitic diodes 150 and 151 are in a forward biased state, thereby being turned on, respectively.

From Time t1 to Time t2 (Time Period (A) in FIG. 12)

When the parasitic diodes 150 and 151 are turned on, respectively, holes and electrons are injected into the n type region 111 and the p type semiconductor substrate 100, respectively, and carriers (electrons and holes) are accumulated. The accumulation of carriers continues until a time period corresponding to the negative voltage noise (time period (A)) ends.

Figure 6:
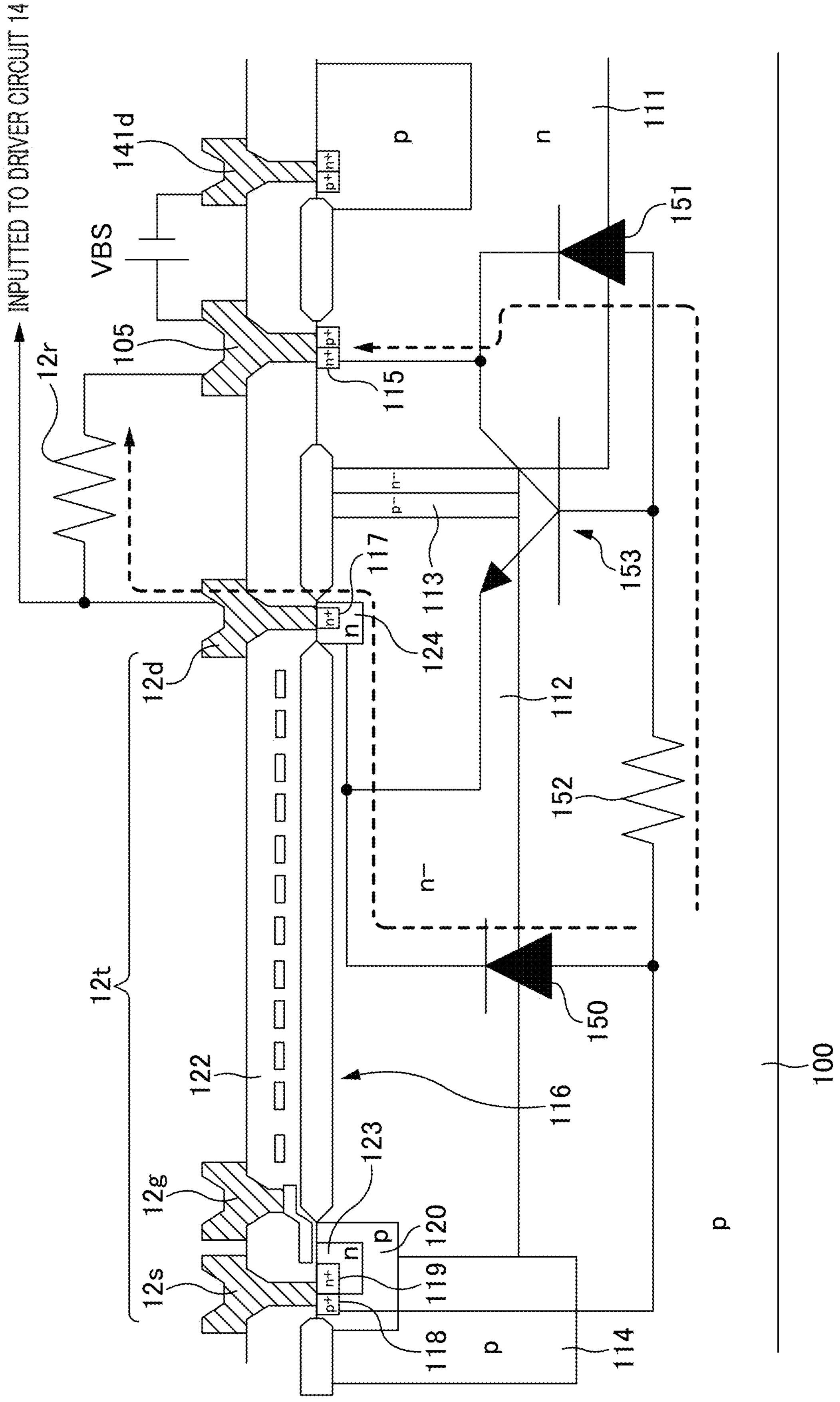
FIG. 6 is a diagram illustrating a current flowing in a semiconductor device 1.

FIG. 6 illustrates the current flowing through the semiconductor device 1 in the time period (A). As illustrated in this figure, a forward current flows through the parasitic diodes 150 and 151.

Time t2

In response to the time period corresponding to the negative voltage noise (time period (A) in FIG. 13) ending and the VB potential recovering from a negative voltage to, for example, 0.6 V or higher at time t2, the parasitic diodes 150 and 151 enters a reverse biased state.

In response to the parasitic diodes 150 and 151 entering the reverse biased state, a so-called reverse recovery current flows.

Figure 7:
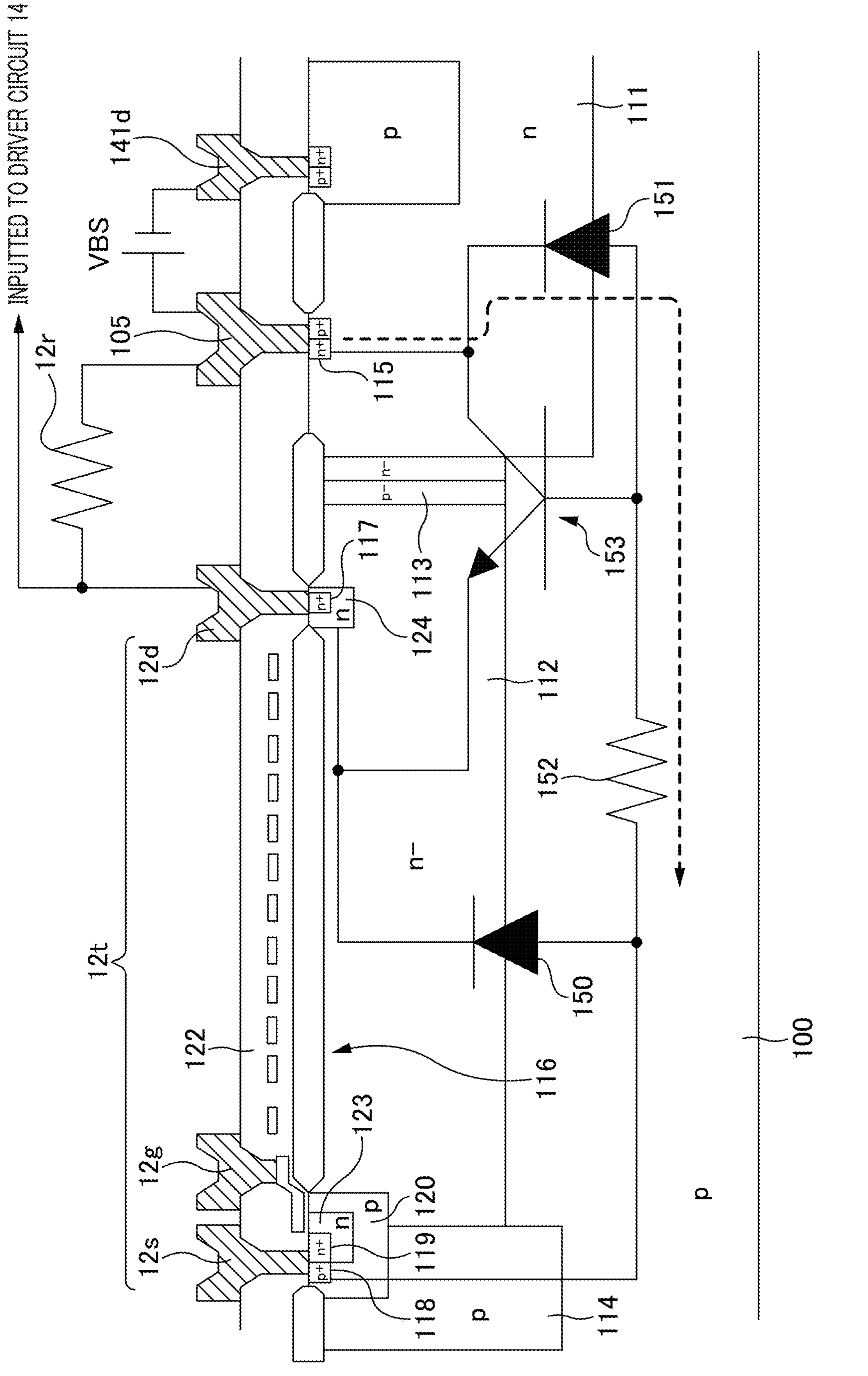
FIG. 7 is a diagram illustrating a current flowing in a semiconductor device 1.

FIG. 7 illustrates the current flowing through the semiconductor device 1 at time t2. As illustrated in this figure, the reverse recovery current flows through the parasitic resistor 152 at time t2. In response to the reverse recovery current flowing through the parasitic resistor 152, the substrate potential rises due to drop in the voltage at the parasitic resistor 152, and the parasitic transistor 153 is turned on.

From Time t2 to Time t3 (Time Period (B))

Figure 8:
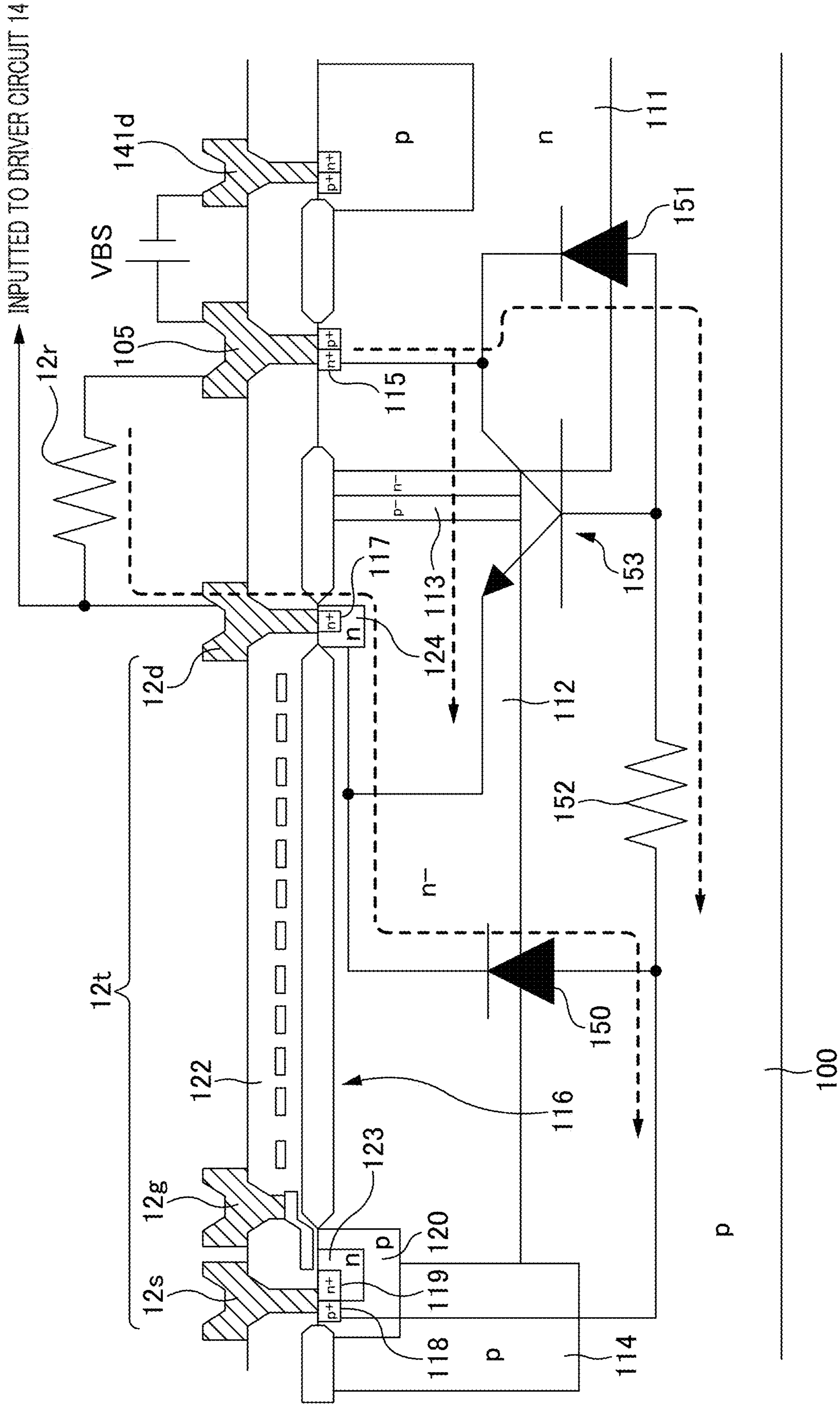
FIG. 8 is a diagram illustrating a current flowing in a semiconductor device 1.

FIG. 8 illustrates the current flowing through the semiconductor device 1 in a time period (B). As illustrated in this figure, the reverse recovery current flows between the collector and emitter of the parasitic transistor 153 and through the set-side and reset-side resistors 12*r* and 13*r*.

FIG. 14 illustrates the currents (only the reverse recovery currents) flowing through the parasitic diode 150, the parasitic transistor 153, and the set-side resistor 12*r*.

When the reverse recovery current starting to flow at time t2, the reverse recovery current flowing through the parasitic diode 150 and the parasitic transistor 153 attenuates thereafter (time period (B) in FIG. 14).

Meanwhile, the reverse recovery current also starts to flow through the set-side and reset-side resistors 12*r* and 13*r*, but in the time period (B), this current is smaller than the reverse recovery current flowing through the parasitic diode 150 and the parasitic transistor 153.

From Time t3 to Time t4 (Time Period (C))

From around time t3, the reverse recovery current flowing through the parasitic diode 150 and the parasitic transistor 153 further attenuates, and the reverse recovery current flowing through the set-side and reset-side resistors 12*r* and 13*r* increases (time period (C) in FIG. 14).

In association therewith, the drain voltages of the set-side transistor 12*t* and the reset-side transistor 13*t* start to drop (time period (C) in FIG. 12).

An increase in the reverse recovery current flowing through these resistors 12*r* and 13*r* is caused by the on-resistance of the parasitic transistor 153 starting to increase as compared to the resistances of the resistors 12*r* and 13*r* as the parasitic transistor 153 turns from on to off.

The circuit diagram of FIG. 10 illustrates the path of the reverse recovery current during the time period (C). In this figure, the parasitic diodes 150 and 151, the parasitic resistors 152 and the parasitic transistors 153 are also illustrated.

Time t4

As illustrated in FIG. 12, when the drain voltages of the set-side and reset-side resistors 12*r* and 13*r* drop, the drain voltages of both the set-side and reset-side resistors 12*r* and 13*r* may unintentionally drop below the input threshold voltage of the driver circuit 14.

In such a case, both the set signal SET2 and the reset signal RESET2 will be erroneously outputted to the driver circuit 14.

Note that the typical driver circuit 14 is designed such that the output logic is maintained when the set signal SET2 and the reset signal RESET2 are inputted thereto at the same time. Thus, when the amounts of reduction in the set signal SET2 and the reset signal RESET2 caused by the negative voltage noise are exactly the same, a malfunction does not occur.

However, due to variations in the characteristics of elements, the amounts of drop in the drain voltages on the set side and the reset side will not actually be equal, but will be different.

In this example, as illustrated in FIG. 12, only the drain voltage of the set-side transistor 12*t* drops below the input threshold voltage of the driver circuit 104 at time t4, and the set signal SET2 is erroneously outputted to the driver circuit 104.

In this case, as illustrated in FIG. 11, a malfunction in which the driver circuit 14 erroneously turns on the IGBT 21 at time t4 occurs.

From time t4

Around time t4, the parasitic transistor 153 is turned off.

Figure 9:
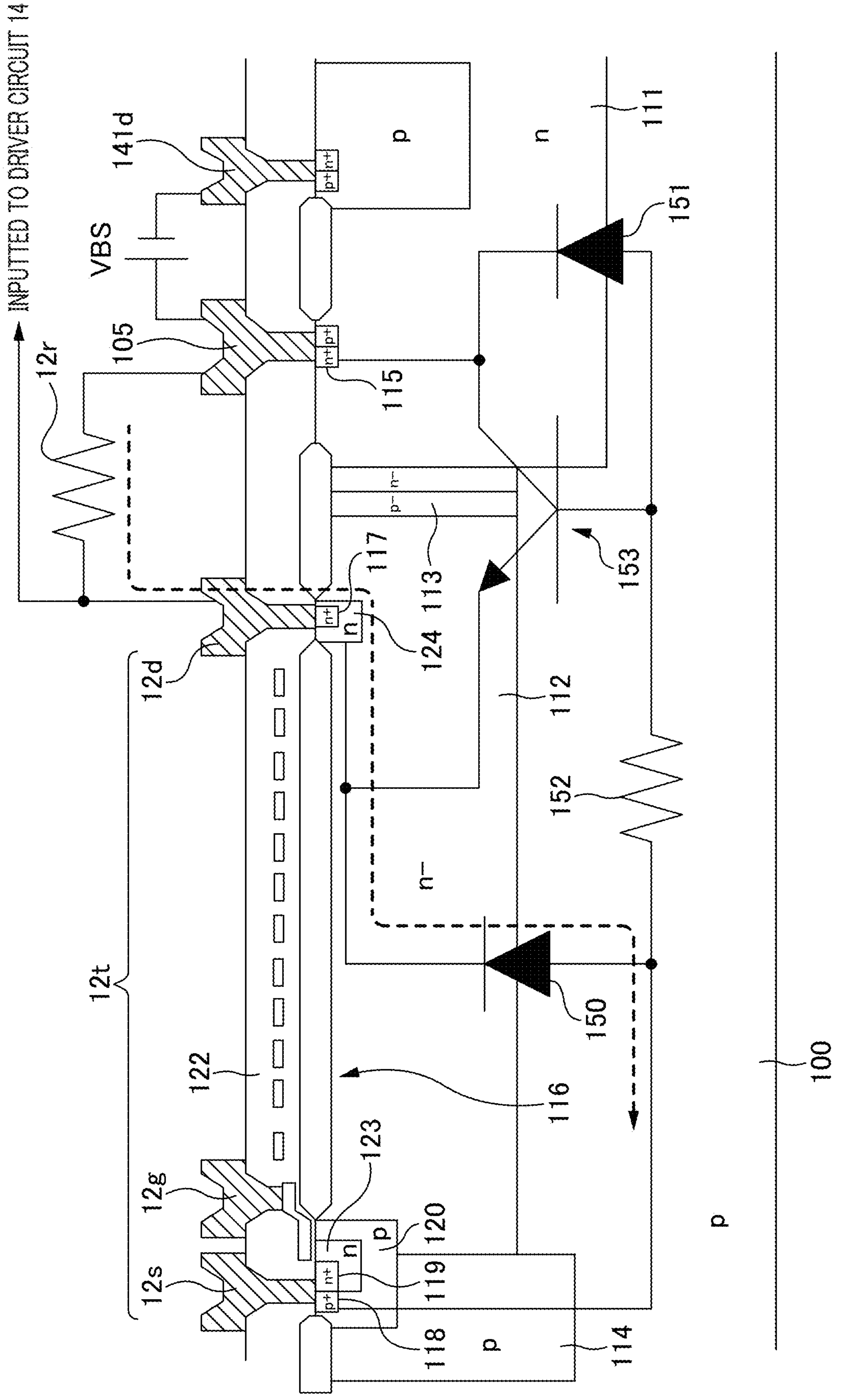
FIG. 9 is a diagram illustrating a current flowing in a semiconductor device 1.
Figure 10:
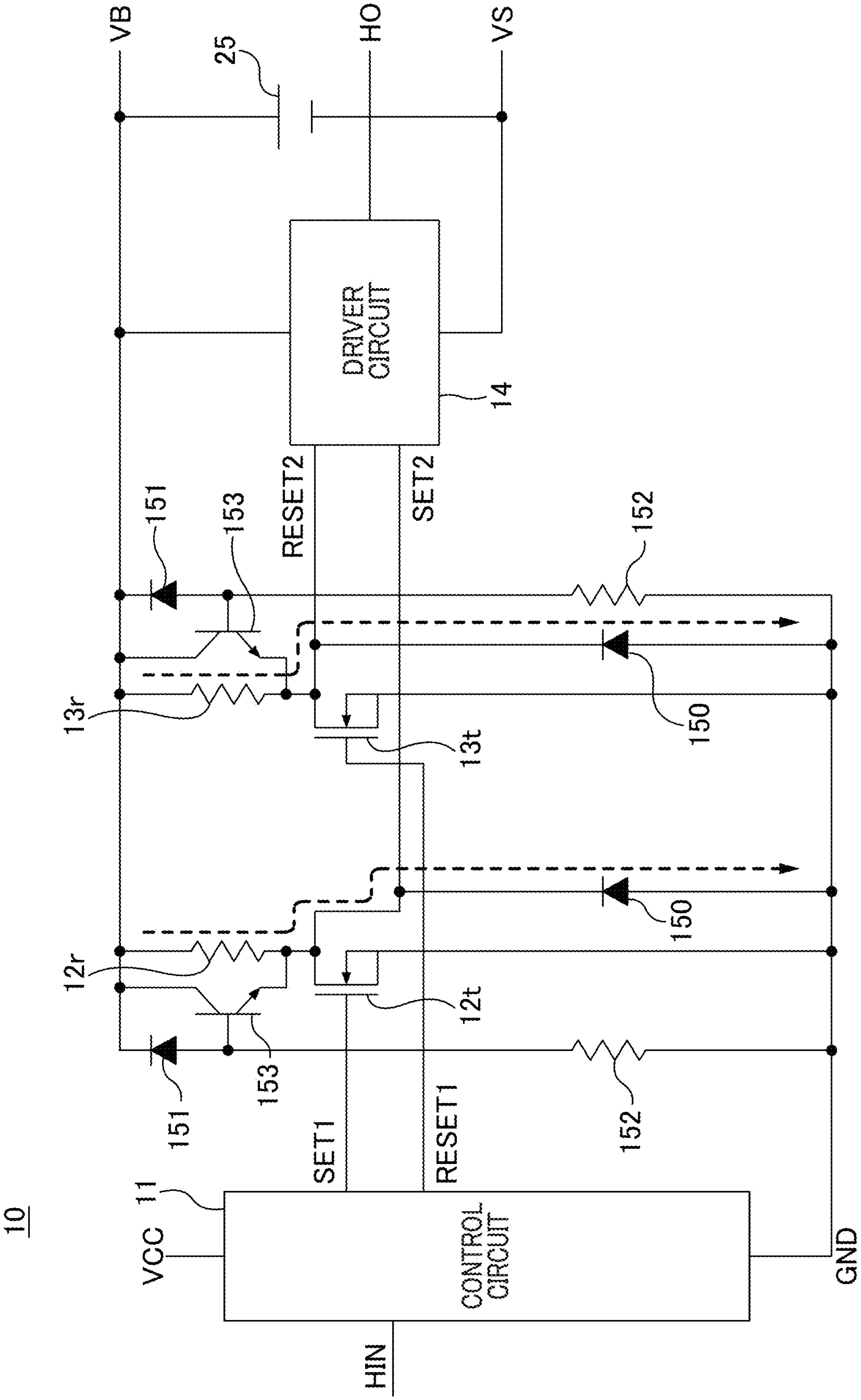
FIG. 10 is a diagram illustrating an unintended current flowing through a switching control circuit 10.

FIG. 9 illustrates the current flowing through the semiconductor device 1 immediately after the parasitic transistor 153 is turned off. As illustrated in this figure, the reverse recovery current flowing through the parasitic transistor 153 disappears, and the reverse recovery currents flowing through the set-side and reset-side resistors 12*r* and 13*r* remain.

Immediately after the parasitic transistor 153 is turned off, the reverse recovery currents flowing through the set-side and reset-side resistors 12*r* and 13*r* reach a peak (around time t4 in FIG. 14). Then, from time t4, the reverse recovery current flowing through the resistors 12*r* and 13*r* attenuates and disappears (time period (D) in FIG. 14).

In response to the reverse recovery current being further reduced, the drain voltages of the transistors 12*t* and 13*t* start to recover (time period (D) in FIG. 12).

The malfunctions occurring in the typical switching control circuit 10 have been described above. As described above, when an unnecessary current flows through the set-side resistor 12*r* particularly, a malfunction in which the driver circuit 14 erroneously turns on the IGBT 21 may occur.

Furthermore, during the time period from when the negative voltage noise is generated at time t1 until when the parasitic transistor 153 is turned off, the level shifter circuits 12 and 13 do not perform signal transmission normally.

Thus, when the input signal inputted to the switching control circuit 10 switches from low to high during this time period, the set signal SET2 is not outputted to the driver circuit 14, which causes a malfunction in which the IGBT 21 is not turned on. The time period during which normal signal transmission cannot be performed is a maximum of about 10 μs.

A switching control circuit 50 according to an embodiment, which will be described next, is capable of preventing a malfunction of a driver circuit caused by the negative voltage noise as described above.

EMBODIMENT

Figure 15:
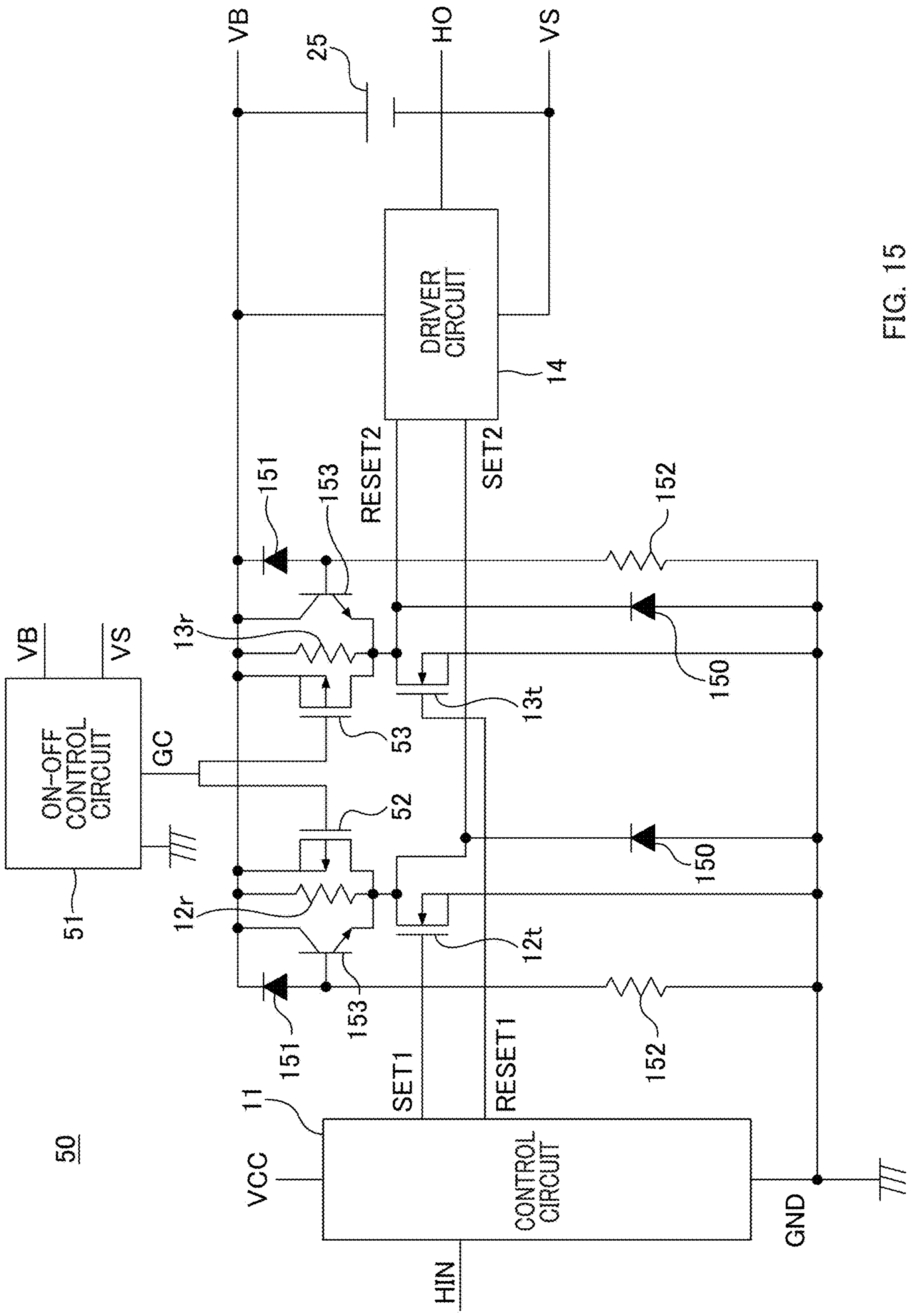
FIG. 15 is a circuit diagram illustrating the details of a switching control circuit 50 according to an embodiment.

FIG. 15 is a circuit diagram illustrating details of the switching control circuit 50 according to an embodiment of the present disclosure. The switching control circuit 50 is different from the typical switching control circuit 10 of FIG. 2, in further including an ON-OFF control circuit 51, a switch 52 (corresponding to a "first switch"), and a switch 53 (corresponding to a "second switch").

In the following, a description will be given mainly of differences between the switching control circuit 50 and the typical switching control circuit 10, and a description of their commonalities are omitted.

[Switch 52]

As described above, if the reverse recovery current flows through the set-side resistor 12*r* due to the negative voltage noise, a malfunction in which the driver circuit 14 erroneously turns on the IGBT 21 may occur.

The switch 52 is provided to prevent the reverse recovery current from flowing through the set-side resistor 12*r* by diverting the reverse recovery current to the switch 52 (details will be described later).

The switch 52 is connected in parallel with the set-side resistor 12r. In an embodiment of the present disclosure, the switch 52 is a p-channel metal-oxide-semiconductor (PMOS) transistor.

[Switch 53]

The switch 53 has the same as or similar configuration that the switch 52 has. The switch 53 is connected in parallel with the reset-side resistor 13r. In an embodiment of the present disclosure, the switch 53 is a PMOS transistor.

Note that if the reverse recovery current flows through the set-side resistor 12r due to the negative voltage noise as described above, a malfunction in which the driver circuit 14 erroneously turns on the IGBT 21 may occur.

In other words, even if the reverse recovery current flows through the reset-side resistor 13r, such a malfunction does not occur as described above. However, with the provision of the switch 53, the circuit structure of the switching control circuit 50 can be made symmetrical between the set side and the reset side. This makes it possible to stabilize circuit operation.

[ON-OFF Control Circuit 51]

The ON-OFF control circuit 51 is provided to control the on and off of the above-described switches 52 and 53.

The ON-OFF control circuit 51 turns on the switch 52, in response to the voltage at the electrode on the low potential side of the switching device 21 becoming negative (in response to the negative voltage noise being generated). In an embodiment of the present disclosure, in response to the negative voltage noise being generated, the ON-OFF control circuit 51 turns on the switch 53 as well.

Figure 16:
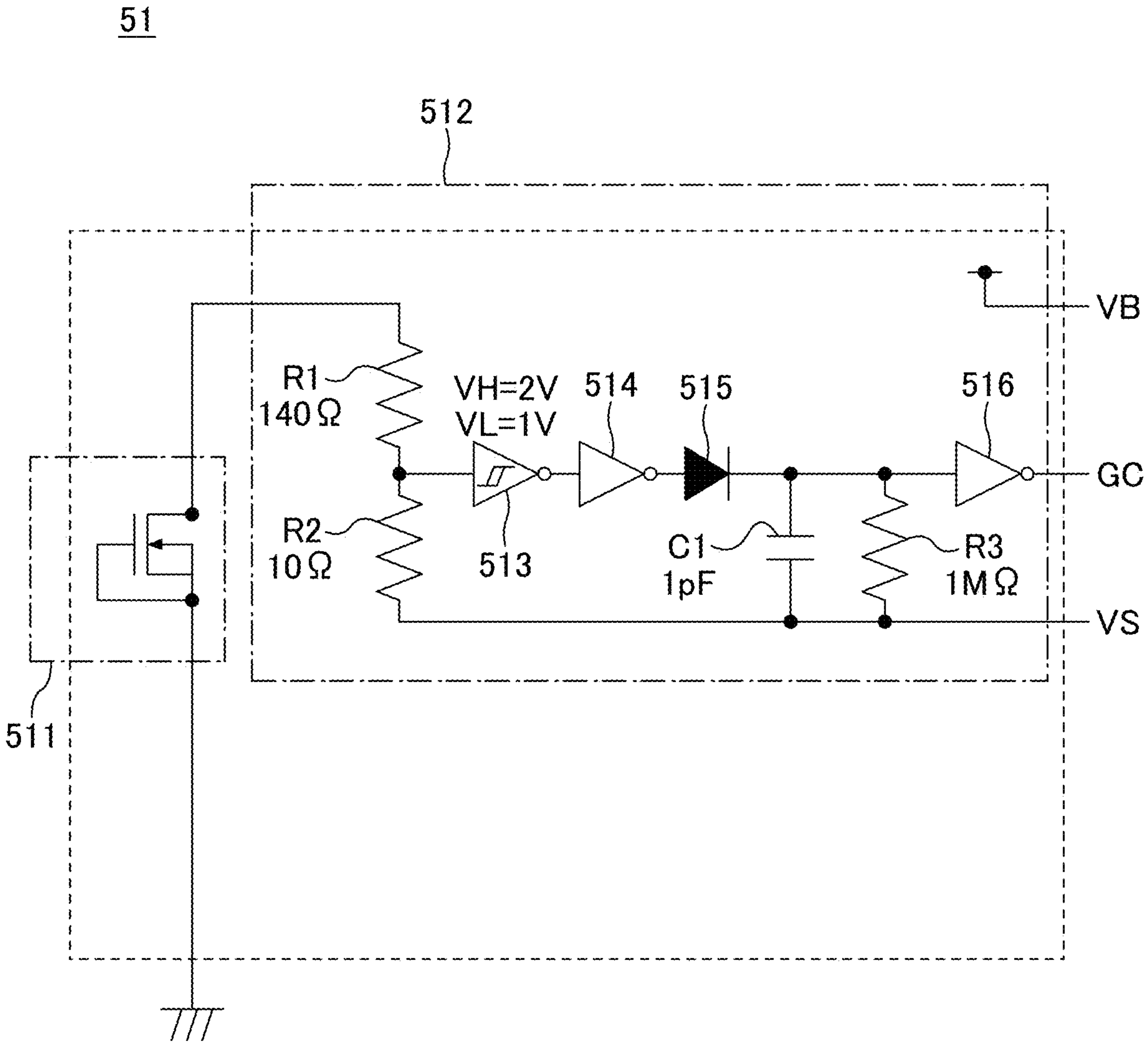
FIG. 16 is a circuit diagram illustrating the details of an ON-OFF control circuit 51.

FIG. 16 is a circuit diagram illustrating the details of the ON-OFF control circuit 51. The ON-OFF control circuit 51 includes a diode element 511 and a circuit 512.

The diode element 511 passes a current when the voltage at the electrode on the low potential side of the switching device 21 is negative (when the negative voltage noise is generated).

In an embodiment of the present disclosure, the diode element 511 is a diode-connected NMOS transistor (corresponding to a "third transistor"). Further, the gate electrode and drain electrode of the NMOS transistor are grounded, and the source electrode thereof is connected to the electrode on low potential side of the switching device 21 through resistors R1 and R2 (described later).

The circuit 512 outputs a signal to turn on the switches 52 and 53 for a predetermined time period, based on the current flowing through the diode element 511. The circuit 512 is formed in the high side region 101 (FIG. 17, which will be described later).

The circuit 512 of an embodiment of the present disclosure includes the resistors R1 and R2 and a resistor R3, a Schmitt trigger circuit 513, NOT circuits 514 and 516, a diode element 515, and a capacitance Cl. These will be described in detail along with the operation of the switching control circuit 50, which will be described later.

<Planar Structure>

Figure 17:
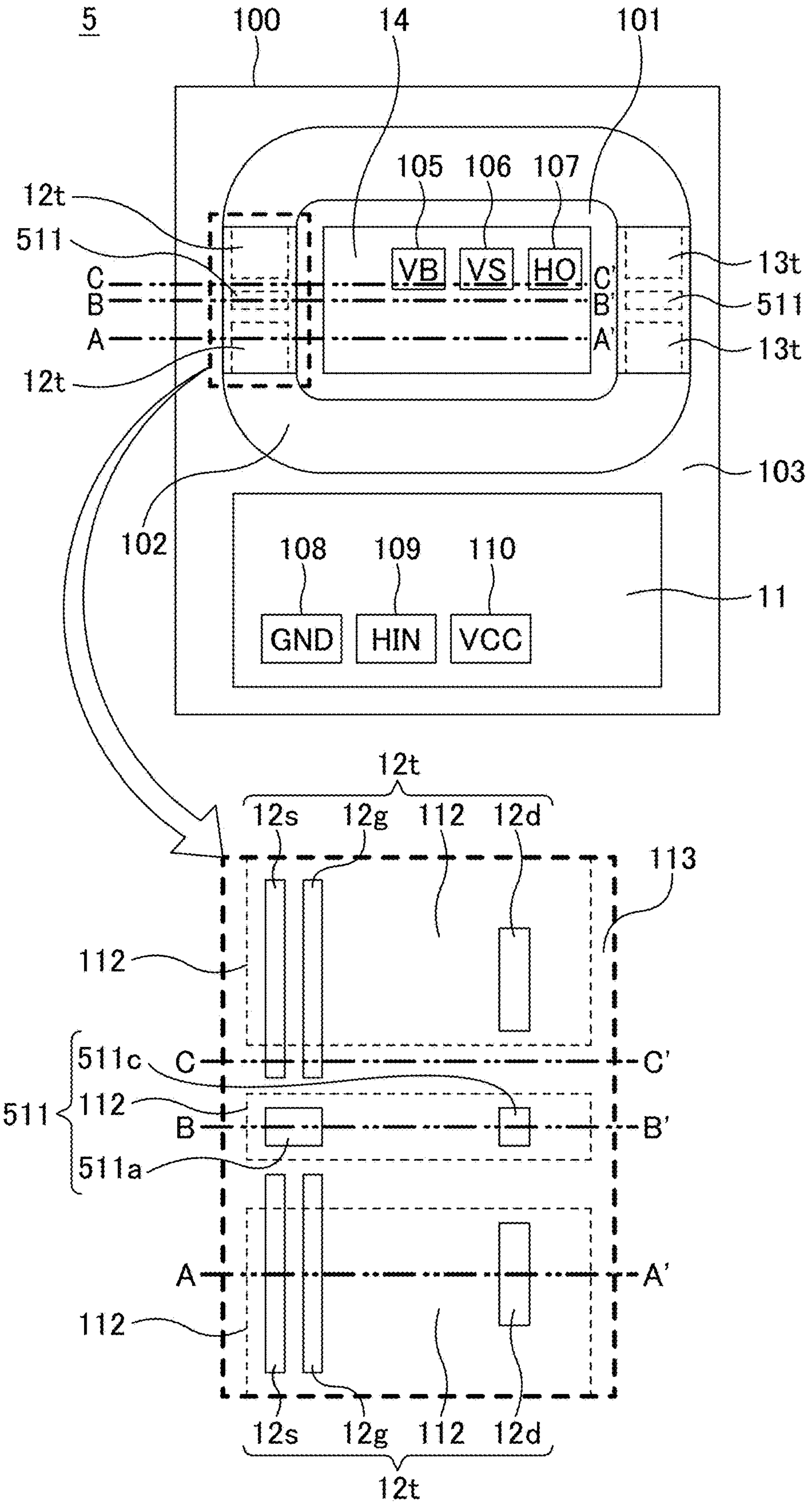
FIG. 17 is a diagram illustrating a semiconductor device 5 to which a switching control circuit 50 is mounted.

FIG. 17 is a diagram illustrating a semiconductor device 5 to which the switching control circuit 50 is mounted. The planar structure of the semiconductor device 5 is different from that of the above-described semiconductor device 1 in the arrangement in the HVJT 102. In the lower part of FIG. 17, an enlarged view of a part of the HVJT 102 is illustrated.

As compared to the case of the typical semiconductor device 1 of FIG. 3, the diode element 511 is further arranged in the HVJT 102.

Further, as illustrated in the lower part of FIG. 17, in the semiconductor device 5, the transistor 12t of the set-side level shifter circuit 12 is configured with two transistors having a common channel direction.

The diode element 511 of the ON-OFF control circuit 51 is arranged between the two transistors 12t. As described above, the diode element 511 is a diode-connected transistor.

That is, the two transistors constituting the transistor 12t and the transistor constituting the diode element 511 (that is, three transistors) are arranged in the HVJT 102.

With such an arrangement, the transistors constituting the transistor 12t and the transistor constituting the diode element 511 have similar characteristics, thereby being able to stabilize circuit operation.

Note that this example gives an aspect in which the transistor 12t is configured with two transistors, but the present disclosure is not limited thereto. In other words, the transistor 12t may be configured with three or more transistors that have a common channel direction.

Meanwhile, the transistor constituting the diode element 511 may also be configured with a plurality of transistors that have a common channel direction.

For example, the transistor 12t may be configured with three transistors, and the diode element 511 may be configured with two transistors.

Then, the three transistors constituting the transistor 12t and the two transistors constituting the diode element 511 may be arranged alternately in a direction perpendicular to the channel direction.

<Cross-Sectional Structure>

Figure 18:
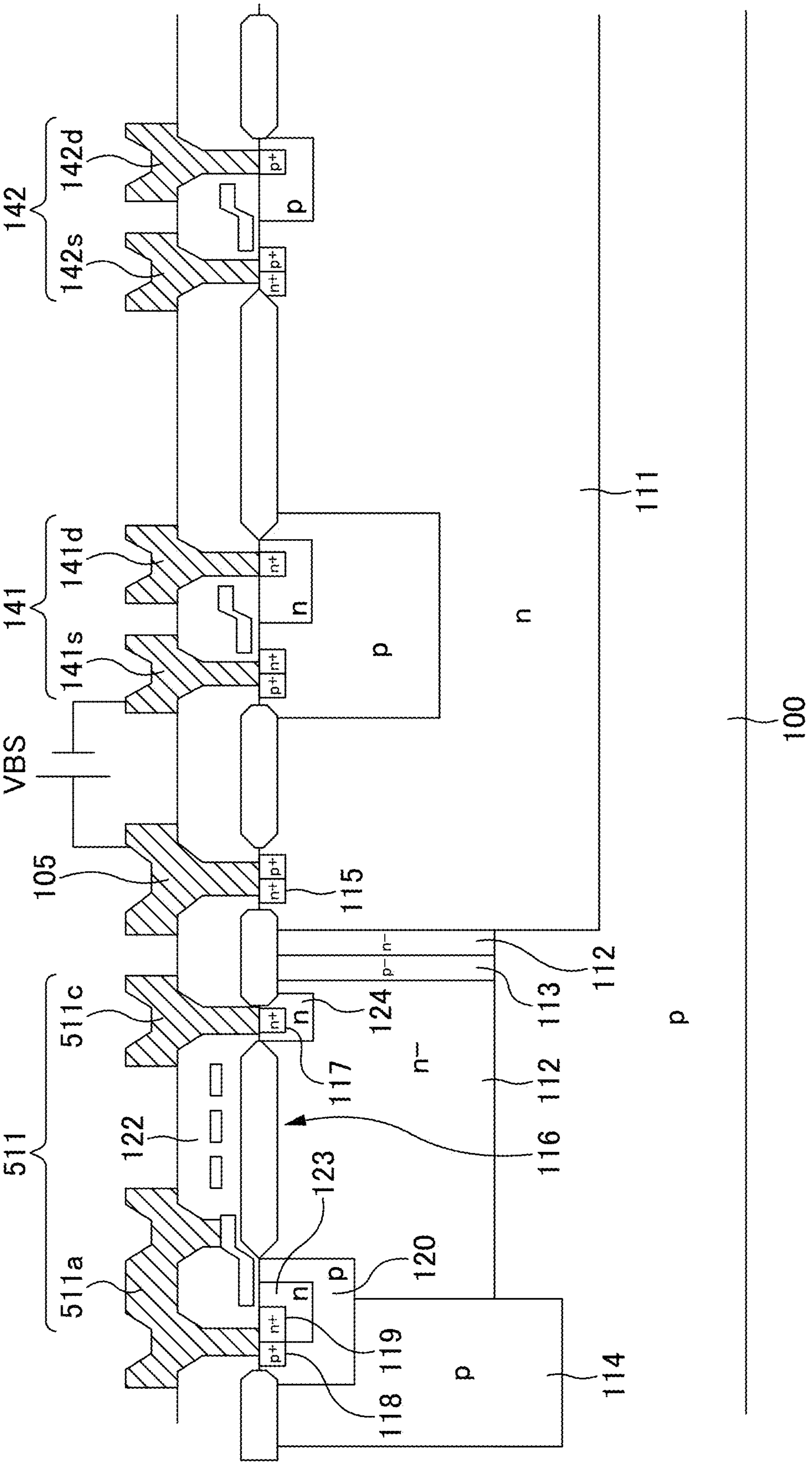
FIG. 18 is a diagram illustrating a partial cross section of a semiconductor device 5.
Figure 19:
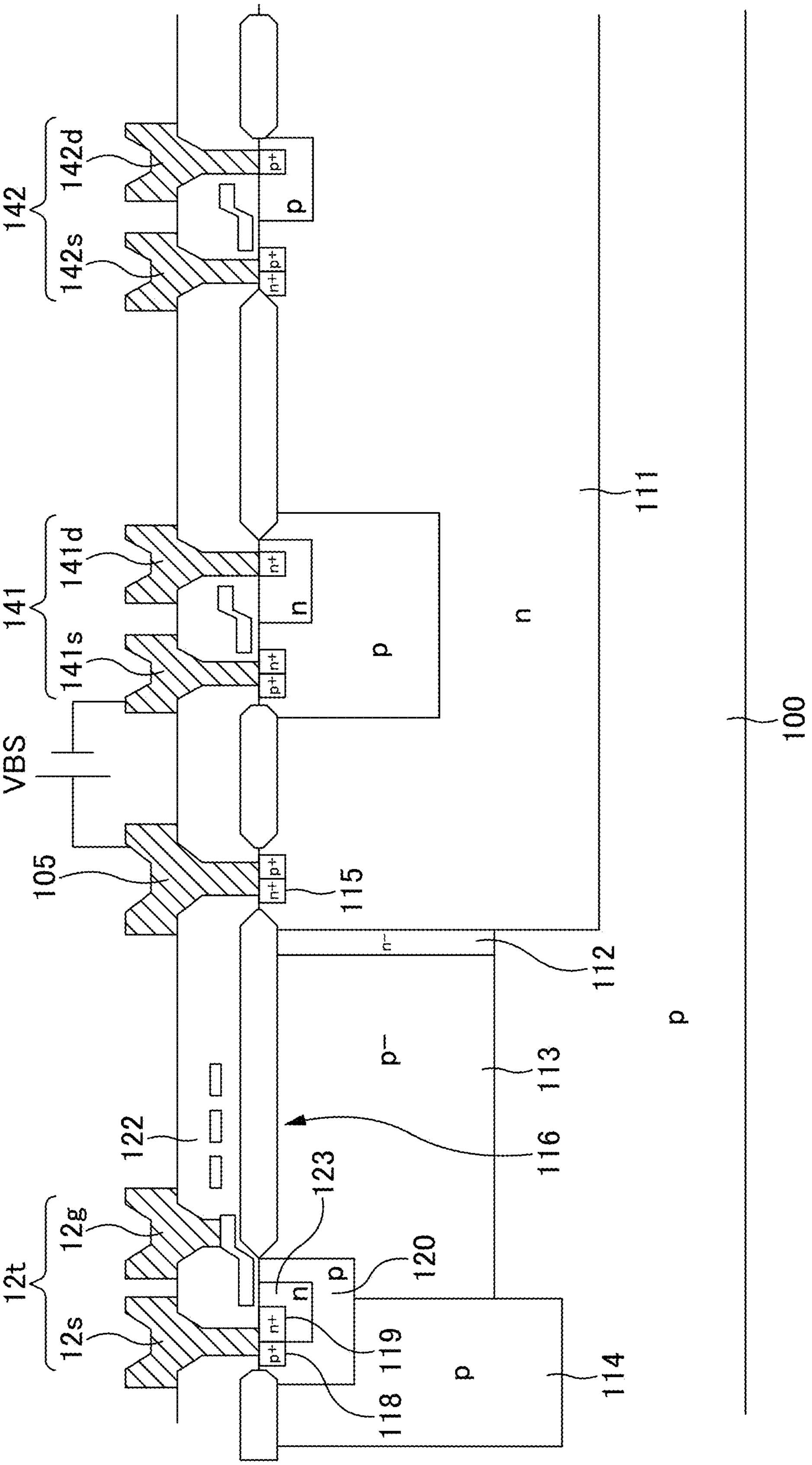
FIG. 19 is a diagram illustrating a partial cross section of a semiconductor device 5.

FIG. 18 is a diagram illustrating a cross section of the semiconductor device 5 taken along line B-B' including a transistor constituting the diode element 511 of FIG. 17. FIG. 19 is a diagram illustrating a cross section of the semiconductor device 5 taken along line C-C' including the p-type region 113 (also referred to as "slit region") in FIG. 17.

The cross section of the semiconductor device 5 taken along line A-A' including the set-side transistor 12t in FIG. 17 is the same as illustrated in FIG. 4.

The cross-sectional structure, illustrated in FIG. 18, taken along line B-B' is different from that illustrated in FIG. 4 in that the transistor 12t in FIG. 4 is replaced with the diode element 511. Specifically, the source electrode 12s and the gate electrode 12g in FIG. 4 are connected to each other in FIG. 18, to thereby form an anode 511a. Further, the drain electrode 12d in FIG. 4 is replaced with a cathode 511c in FIG. 18.

The cross-sectional structure, illustrated in FIG. 19, taken along line C-C' is different from that illustrated in FIG. 4 in that the p− type region 113 extends across an isolation region.

In other words, the p− type region 113 is provided in a slit shape along line C-C' of FIG. 17, and the diode element 511 is electrically isolated from the transistor 12t by the pn junction between the p− type region 113 and the n− type region 112 surrounding the p-type region 113.

<<<Operation of Switching Control Circuit 50>>>

An operation of the switching control circuit 50 according to an embodiment of the present disclosure will be described using the above-described typical switching control circuit 10 as a comparative example.

Figure 20:
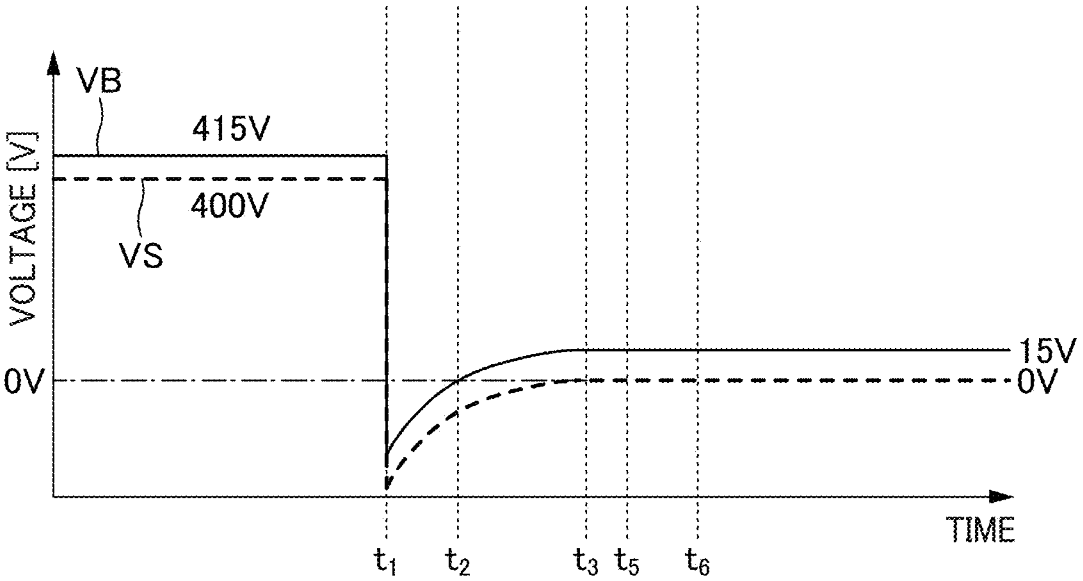
FIG. 20 is a timing chart of VB potential and VS potential.
Figure 21:
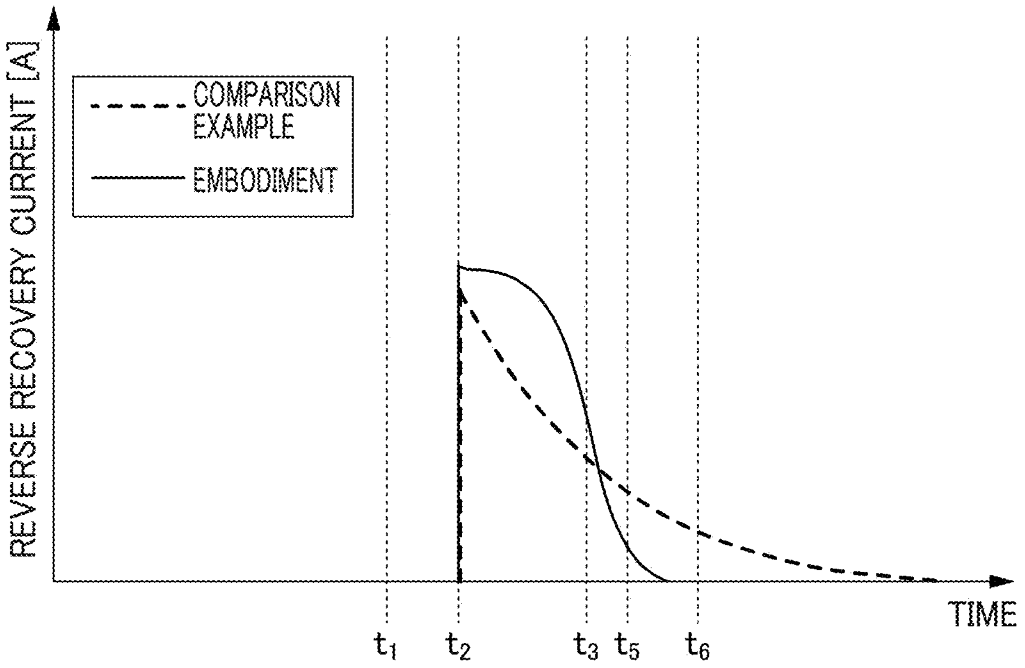
FIG. 21 is a timing chart of a current flowing through a resistor 13*r*.

FIGS. 20 to 24 are diagrams illustrating an operation of the switching control circuit 50. FIGS. 20 to 23 are various timing charts of the switching control circuit 50, where FIG. 20 illustrates the VB potential and the VS potential, FIG. 21 illustrates the current flowing through the resistor 13r, FIG.

Figure 23:
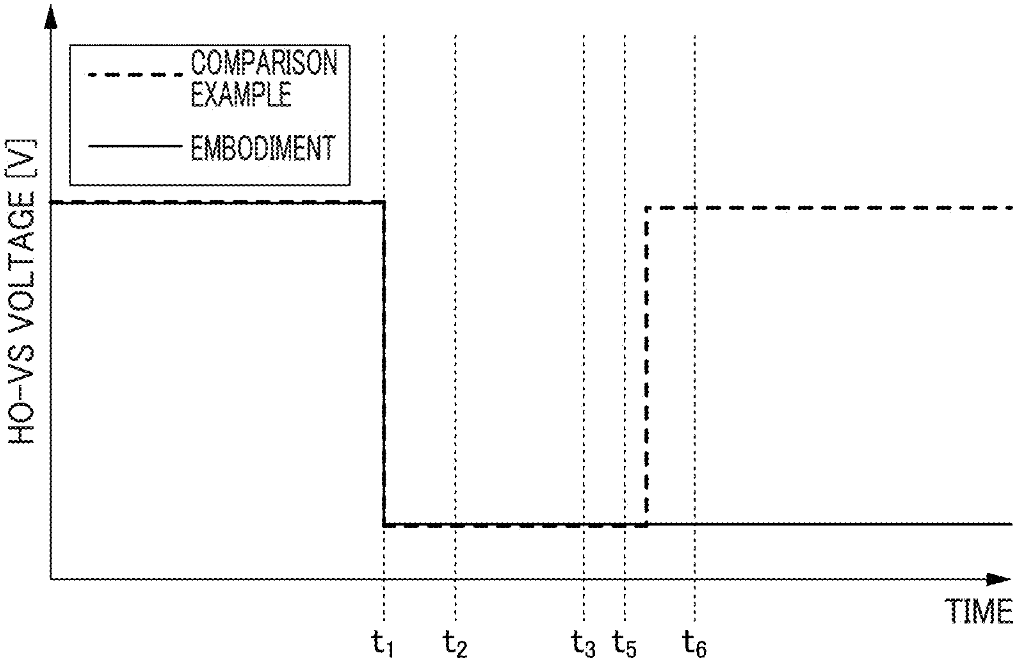
FIG. 23 is a timing chart of the HO-VS voltage from a driver circuit 14.
Figure 24:
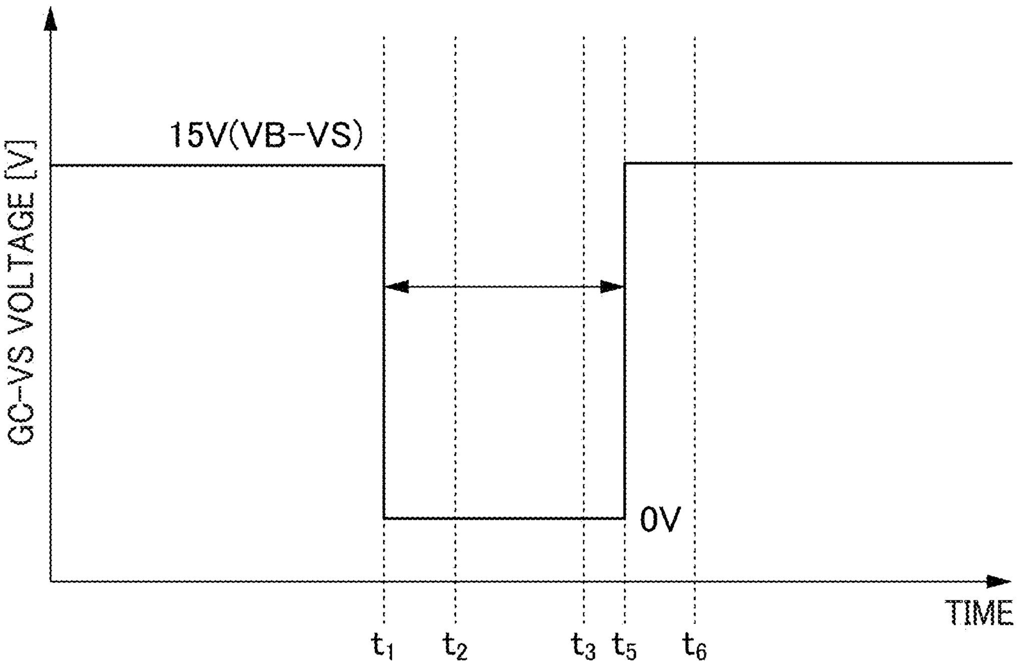
FIG. 24 is a timing chart of the GC-VS voltage from an ON-OFF control circuit.

22 illustrates the drain voltage of the set-side transistor 12*t*, and FIG. 23 illustrates the HO-VS voltage from the driver circuit 14. FIG. 24 illustrates the GC-VS voltage from the ON-OFF control circuit.

The following describes an operation of the switching control circuit 50 in chronological order. Note that the waveforms of the comparative example illustrated in FIGS. 20 to 24 are the same as those in the example of FIGS. 11 to 14. Further, in FIGS. 20 to 24, time t1, t2, and t3 are the same as time t1, t2, and t3 in the example of FIGS. 11 to 14. In FIGS. 21 to 24, time t5 and time t6 correspond to time after time t3.

Before Time t1

In the state in which the negative voltage noise is not generated (before and at time t1), in an embodiment of the present disclosure, the potential at the output terminal GC of the ON-OFF control circuit 51 is GC−VS=15 V (VB−VS). In other words, the switches 52 and 53 (FIG. 15) are off.

From Time t1 to Time t2 (Time Period (A))

Figure 22:
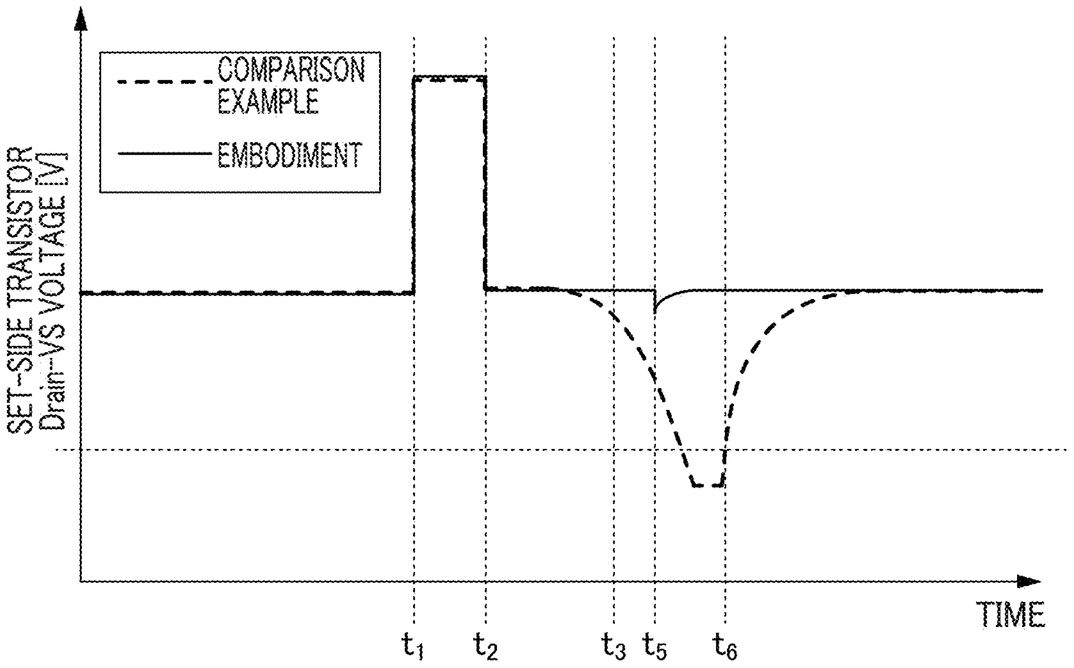
FIG. 22 is a timing chart of the drain voltage of a set-side and reset-side transistor 12*t*, 13*t*.

In an embodiment of the present disclosure and the comparative example, in response to the low-side switching device 22 being turned on at time t1 and the negative voltage noise being generated, the drain potentials at the set-side transistor 12*t* and the reset-side transistor 13*t* rise (FIG. 22).

In an embodiment of the present disclosure, in response to the drain potentials of the transistors 12*t* and 13*t* exceeding the VS potential by, for example, 30 V or more, the output voltage of the voltage divider resistor configured with the resistors R1 and R2 of the ON-OFF control circuit 51 (FIG. 16) exceeds the threshold voltage (2 V in an embodiment of the present disclosure) of the Schmitt trigger circuit 513, and the potential at the output terminal GC is changed to GC−VS=0 V.

In this event, the Schmitt trigger circuit 513 outputs a low signal to the NOT circuit 514. Then, the NOT circuit 514 outputs a high signal.

Then, the capacitance Cl is charged through the diode element 515. In response to the voltage at the capacitance Cl exceeding the threshold of the NOT circuit 516, a high signal is outputted to the NOT circuit 516, and the NOT circuit 516 outputs a low signal.

This turns on the switches 52 and 53 (FIG. 15). Note that after the time period corresponding to the negative voltage noise ends (from time t2) as well, the switches 52 and 53 are kept on for a predetermined time period (Ti) by the circuit 512 (FIG. 16).

Note that in response to the NOT circuit 516 in the circuit 512 starting to output a low signal, the capacitance Cl starts to be discharged through the resistor R3. Then, in response to the voltage at the capacitance Cl dropping below the threshold of the NOT circuit 516, the NOT circuit 516 outputs a high signal. This turns off the switches 52 and 53 (FIG. 15).

The time period (Ti) from the ending of the time period corresponding to the negative voltage noise until turning off of the switches 52 and 53 (FIG. 15) can be set to a predetermined time period by adjusting the capacitance value of the capacitance Cl and the resistance value of the resistor R3 mainly.

Time t2 to t5

In an embodiment of the present disclosure, in response to the time period corresponding to the negative voltage noise ending at time t2 and the VS potential rising, the reverse recovery current starts to flow through the parasitic diode 150.

In the comparative example, the reverse recovery current flowing through the parasitic transistor 153 attenuates, and the reverse recovery current flowing through the resistors 12*r* and 13*r* starts to rise (the same as in the time period (B) in FIG. 14).

Meanwhile, in an embodiment of the present disclosure, the reverse recovery currents flow through the switches 52 and 53 (FIG. 15) that are on. This suppresses the reverse recovery currents flowing through the resistors 12*r* and 13*r*.

Thus, in an embodiment of the present disclosure, the currents flowing through the resistors 12*r* and 13*r* are smaller than those in the comparative example, and drop in the drain voltages of the transistors 12*t* and 13*t* is suppressed (from time t2 to time t5 in FIG. 22).

From Time t5 to Time t6

In an embodiment of the present disclosure, in response to a predetermined time period (Ti) having elapsed since the ending (time t2) of the time period corresponding to the negative voltage noise, the switches 52 and 53 are turned off (time t5).

The time period Ti is previously set as the time period for discharging the accumulated carriers, as described above. Accordingly, at the time when the switches 52 and 53 have been turned off, the reverse recovery current has substantially disappeared.

Thus, according to the switching control circuit 50, it is possible to prevent malfunctions caused by drop in the drain voltages of the transistors 12*t* and 13*t*, after the switches 52 and 53 are turned off (FIG. 23).

Note that in an embodiment of the present disclosure, signal transmission cannot be performed during the time period from when the negative voltage noise is generated (time t1) until when the switches 52 and 53 are turned off (time t5), and signal transmission can be performed from time t5.

Time t6

In the comparative example, as the reverse recovery currents flowing through the resistors 12*r* and 13*r* (FIG. 2) attenuate, the drain voltage of the set-side transistor 12*t* exceeds the input threshold of the driver circuit 14 (time t6 in FIG. 22).

In other words, in the comparative example, signal transmission cannot be performed during the time period from when the negative voltage noise is generated at time t1 to time t6, and signal transmission can be performed from time t6.

Here, the time periods during which signal transmission cannot be performed in an embodiment of the present disclosure and the comparative example will be summarized. As described above, in an embodiment of the present disclosure, the time period during which signal transmission cannot be performed corresponds to the time period from time t1 to time t5. Meanwhile, in the comparative example, the time period during which signal transmission cannot be performed corresponds to the time period from time t1 to time t6 (>t5).

That is, according to an embodiment of the present disclosure, the time period during which signal transmission cannot be performed can be reduced shorter than that in the comparative example.

The time period from when the negative voltage noise is generated to when the reverse recovery current disappears depends on the magnitude of the reverse recovery current and the impedance of the reverse recovery current supply path.

In an embodiment of the present disclosure, with the impedance of the reverse recovery current supply path being lowered during the time period during which the switches 52 and 53 are on, the reverse recovery current that is larger than that in the comparative example flows (from time t2 to time t3 in FIG. 21).

Thus, according to an embodiment of the present disclosure, the reverse recovery current disappears in a time period shorter than that in the comparative example. This reduces the time period during which signal transmission cannot be performed in an embodiment of the present disclosure shorter than that in the comparative example (FIG. 22).

According to the switching control circuit 50 of an embodiment of the present disclosure described above, it is possible to prevent malfunctions of the driver circuit caused by the negative voltage noise.

SUMMARY

The switching control circuit 50 of an embodiment of the present disclosure described above is a switching control circuit configured to control switching of a first switching device on a power supply side and a second switching device on a ground side, the first and second switching devices being configured to drive the load, the switching control circuit including: a first level shifter circuit including a first resistor and a first transistor; a driver circuit 14 configured to drive the first switching device, in response to an output from the first level shifter circuit; a first switch connected in parallel with the first resistor; and an ON-OFF control circuit 51 configured to turn on the first switch, in response to a voltage at an electrode on a low-potential side of the first switching device becoming negative.

According to such a configuration, it is possible to restrain the reverse recovery current in association with the generation of the negative voltage noise from flowing through the first resistor, by the reverse recovery current flowing through the first switch. Accordingly, it is possible to prevent malfunctions of the driver circuit caused by the negative voltage noise.

The switching control circuit 50 includes: a second level shifter circuit including a second resistor and a second transistor, wherein the first level shifter circuit outputs a set signal to switch the first switching device from off to on, the second level shifter circuit outputs a reset signal to switch the first switching device from on to off, and the driver circuit 14 drives the first switching device in response to the set signal and the reset signal. Such a configuration enhances symmetry of the switching control circuit 50 between the set side and the reset side. This stabilizes circuit operation.

Further, the switching control circuit further includes a second switch connected in parallel with the second resistor, wherein the ON-OFF control circuit turns on the second switch, in response to the voltage at the electrode on the low potential side becoming negative. Such a configuration further enhances the symmetry of the switching control circuit 50 between the set side and the reset side. This stabilizes circuit operation.

In the switching control circuit 50 described above, each of the first transistor and the second transistor is an n-channel metal-oxide-semiconductor (NMOS) transistor, and each of the first switch and the second switch is a p-channel metal-oxide-semiconductor (PMOS) transistor. According to such a configuration, manufacturing of the switching control circuit 50 is facilitated.

The switching control circuit 50 described above includes the control circuit 11 configured to control the first level shifter circuit, wherein the driver circuit 14 is formed in the high side region of the substrate, and the control circuit 11 is formed in the reference potential region that is electrically isolated from the high side region by the high voltage junction termination region that is provided around the high side region. According to such a configuration, it is possible to suppress interference between the driver circuit 14 and the control circuit 11.

In the switching control circuit 50 described above, the ON-OFF control circuit 51 includes the diode element 515 configured to pass a current when the voltage at the electrode on the low potential side is negative, and the circuit 512 configured to output a signal to turn on the first switch to be kept on for a predetermined time period, based on a current flowing through the diode element 515. According to such a configuration, by previously determining the time period during which the first switch is to be on, it is possible to reduce the time period during which signal transmission cannot be performed as much as possible.

In the switching control circuit described above, the diode element is the third transistor that is diode-connected, each of the first transistor and the third transistor includes a plurality of transistors having a common channel direction, and the plurality of transistors are such that the transistors constituting the first transistor and the transistors constituting the third transistors are arranged alternately in a direction perpendicular to the channel direction. Such a configuration can cause the first transistor and the third transistor to have similar characteristics, thereby being able to stabilize circuit operation.

The switching control circuit described above further includes: the control circuit configured to control the first level shifter circuit, wherein the driver circuit is formed in the high side region of the substrate, the control circuit is formed in the reference potential region that is electrically isolated from the high side region by the high voltage junction termination region that is provided around the high side region, and the plurality of transistors are formed in the high voltage junction termination region. According to such a configuration, it is possible to suppress interference between the driver circuit 14 and the control circuit 11.

The present disclosure is directed to provision of a switching control circuit capable of preventing malfunctions of a driver circuit caused by negative voltage noise.

According to the present disclosure, it is possible to provide a switching control circuit capable of preventing malfunctions of a driver circuit caused by negative voltage noise.

An embodiment of the present disclosure described above is simply to facilitate understanding of the present disclosure and is not in any way to be construed as limiting the present disclosure. The present disclosure may variously be changed or altered without departing from its essential features and encompass equivalents thereof.

What is claimed is:

1. A switching control circuit configured to control switching of a first switching device on a power supply side and a second switching device on a ground side, the first and second switching devices being configured to drive a load, the first switching device having an electrode on a low-potential side thereof, the switching control circuit comprising:

- a first level shifter circuit including a first resistor and a first transistor;
- a driver circuit configured to drive the first switching device, in response to an output from the first level shifter circuit;
- a first switch connected in parallel with the first resistor; and an ON-OFF control circuit configured to turn on the first switch, in response to a voltage at the electrode becoming negative, wherein the first resistor has a first terminal connected to a high potential side of a power supply referenced to a node at which the first switching device and the second switching device are connected, and a second terminal connected to a drain of the first transistor and the driver circuit.

2. The switching control circuit according to claim 1, further comprising:

a second level shifter circuit including a second resistor and a second transistor, wherein the first level shifter circuit is configured to output a set signal to switch the first switching device from off to on, the second level shifter circuit is configured to output a reset signal to switch the first switching device from on to off, and the driver circuit drives the first switching device in response to the set signal and the reset signal.

3. The switching control circuit according to claim 2, further comprising:

a second switch connected in parallel with the second resistor, wherein the ON-OFF control circuit is configured to turn on the second switch, in response to the voltage at the electrode becoming negative.

4. The switching control circuit according to claim 3, wherein each of the first transistor and the second transistor is an n-channel metal-oxide-semiconductor (NMOS) transistor, and each of the first switch and the second switch is a p-channel metal-oxide-semiconductor (PMOS) transistor.

5. The switching control circuit according to claim 1, wherein the switching control circuit is mounted on a semiconductor device that has, on a substrate thereof, a high side region, a high voltage junction termination region that is provided around the high side region, and a reference potential region that is electrically isolated from the high side region by the high voltage junction termination region; and the switching control circuit further includes a control circuit configured to control the first level shifter circuit, wherein the driver circuit is formed in the high side region, and the control circuit is formed in the reference potential region.

6. A switching control circuit configured to control switching of a first switching device on a power supply side and a second switching device on a ground side, the first and second switching devices being configured to drive a load, the first switching device having an electrode on a low-potential side thereof, the switching control circuit comprising:

a first level shifter circuit including a first resistor and a first transistor;

a driver circuit configured to drive the first switching device, in response to an output from the first level shifter circuit;

a first switch connected in parallel with the first resistor; and an ON-OFF control circuit configured to turn on the first switch, in response to a voltage at the electrode becoming negative, wherein the ON-OFF control circuit includes:

a diode element configured to pass a current when the voltage at the electrode is negative, and a signal output circuit configured to output a signal to turn on the first switch and to keep the first switch on for a predetermined time period, based on the current flowing through the diode element.

7. The switching control circuit according to claim 6, wherein the diode element is a third transistor that is diode-connected, each of the first transistor and the third transistor is configured with a plurality of transistors having a common channel direction, such that the plurality of transistors constituting the first transistor and the plurality of transistors constituting the third transistors are arranged alternately in a direction perpendicular to the common channel direction.

8. The switching control circuit according to claim 7, wherein the switching control circuit is mounted on a semiconductor device that has, on a substrate thereof, a high side region, a high voltage junction termination region that is provided around the high side region, and a reference potential region that is electrically isolated from the high side region by the high voltage junction termination region; and the switching control circuit further includes a control circuit configured to control the first level shifter circuit, wherein the driver circuit is formed in the high side region, the control circuit is formed in the reference potential region, and the plurality of transistors in each of the first transistor and the third transistor is formed in the high voltage junction termination region.

9. The switching control circuit according to claim 1, wherein the ON-OFF control circuit includes:

a diode element configured to pass a current when the voltage at the electrode is negative, and a signal output circuit configured to output a signal to turn on the first switch and to keep the first switch on for a predetermined time period, based on the current flowing through the diode element.

* * * * *